(12) United States Patent
Treibergs et al.

(10) Patent No.: US 11,821,943 B2
(45) Date of Patent: Nov. 21, 2023

(54) COMPLIANT GROUND BLOCK AND TESTING SYSTEM HAVING COMPLIANT GROUND BLOCK

(71) Applicant: Johnstech International Corporation, Minneapolis, MN (US)

(72) Inventors: Valts Treibergs, White Bear Township, MN (US); Pat Joyal, North Branch, MN (US); Leslie Fliegelman, Andover, MN (US); Max A. Carideo, Plymouth, MN (US)

(73) Assignee: Johnstech International Corporation, Minneapolis, MN (US)

( * ) Notice: Subject to any disclaimer, the term of this patent is extended or adjusted under 35 U.S.C. 154(b) by 18 days.

(21) Appl. No.: 17/494,086

(22) Filed: Oct. 5, 2021

(65) Prior Publication Data
US 2022/0107359 A1   Apr. 7, 2022

Related U.S. Application Data

(60) Provisional application No. 63/088,007, filed on Oct. 6, 2020.

(51) Int. Cl.
*G01R 31/28* (2006.01)

(52) U.S. Cl.
CPC .............................. *G01R 31/2889* (2013.01)

(58) Field of Classification Search
CPC .......................... G01R 1/0466; G01R 31/2889
See application file for complete search history.

(56) References Cited

U.S. PATENT DOCUMENTS

| 6,299,459 | B1 | 10/2001 | Botka et al. |
| 6,861,667 | B2 | 3/2005 | Gilk et al. |
(Continued)

FOREIGN PATENT DOCUMENTS

| KR | 102121754 B1 | 6/2020 |
| TW | D205153 | 6/2020 |

OTHER PUBLICATIONS

International Search Report and Written Opinion, International Patent Application No. PCT/US21/53488, dated Dec. 29, 2021 (10 pages).

(Continued)

*Primary Examiner* — Jermele M Hollington
*Assistant Examiner* — Suresh K Rajaputra
(74) *Attorney, Agent, or Firm* — Hamre, Schumann, Mueller & Larson, P.C.

(57) ABSTRACT

A compliant ground block for a testing system for testing integrated circuit devices is disclosed. The compliant ground block includes a plurality of electrically conductive blades in a side by side generally parallel relationship. The blades are configured to be longitudinally slidable with respect to each other. The block also includes an elastomer configured to retain the plurality of blades. Each blade of the plurality of blades includes a first end and a second end opposite to the first end in the longitudinal direction. The plurality of blades is arranged so that the first end of each blade of the plurality of blades is opposite to the first end of an adjacent blade in the longitudinal direction so that the first end of one blade is adjacent the second end of the adjacent blade. The elastomer is at least tubular (e.g., hollow or solid cylindrical) in part and non-conductive.

20 Claims, 26 Drawing Sheets

(56) References Cited

U.S. PATENT DOCUMENTS

| | | | |
|---|---|---|---|
| 7,074,049 B2 | 7/2006 | O'Sullivan et al. | |
| 7,255,576 B2 | 8/2007 | O'Sullivan et al. | |
| 7,862,391 B2 | 1/2011 | Johnston et al. | |
| 3,460,010 A1 | 6/2013 | Kimura et al. | |
| 2003/0232516 A1 | 12/2003 | Bedell et al. | |
| 2008/0006103 A1* | 1/2008 | Sherry | G01R 1/06772 73/866.5 |
| 2008/0297142 A1 | 8/2008 | Alladio et al. | |
| 2009/035960 A1 | 2/2009 | Osato et al. | |
| 2010/0062662 A1* | 3/2010 | Osato | G01R 1/0466 439/824 |
| 2010/0134119 A1 | 6/2010 | Sherry | |
| 2014/0103952 A1* | 4/2014 | Kuong | G01R 1/0466 324/755.01 |
| 2014/0127953 A1* | 5/2014 | Foong | G01R 1/0466 439/816 |
| 2022/0229106 A1* | 7/2022 | Carideo | G01R 1/0466 |

OTHER PUBLICATIONS

Office Action issued in Taiwan Design Patent Application No. 110303723, dated Apr. 11, 2022, with summary translation (4 pages).

* cited by examiner

COMPLIANT GROUND BLOCK AND
TESTING SYSTEM HAVING COMPLIANT
GROUND BLOCK

TECHNICAL FIELD

This disclosure relates generally to the field of testing microcircuits (e.g., chips such as semiconductor devices, integrated circuits, etc.). More specifically, the disclosure relates to compliant ground blocks that provide electrical and/or thermal grounding to a device under test (DUT) by making contact to a load board of a testing system, and relates to testing systems having compliant ground blocks.

BACKGROUND

The manufacturing processes for microcircuits cannot guarantee that every microcircuit is fully functional. Dimensions of individual microcircuits are microscopic and process steps very complex, so small or subtle failures in a manufacturing process can often result in defective devices. Mounting a defective microcircuit on a circuit board is relatively costly. Installation usually involves soldering the microcircuit onto the circuit board. Once mounted on a circuit board, removing a microcircuit is problematic because the very act of melting the solder for a second time may ruin the circuit board. Thus, if the microcircuit is defective, the circuit board itself is probably ruined as well, meaning that the entire value added to the circuit board at that point is lost. For all these reasons, a microcircuit is usually tested before installation on a circuit board. Each microcircuit must be tested in a way that identifies all defective devices, but yet does not improperly identify good devices as defective. Either kind of error, if frequent, adds substantial overall cost to the circuit board manufacturing process.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacing between them, even small errors in making the contact will result in incorrect connections. A further problem in microcircuit test equipment arises in automated testing. Testing equipment may test one hundred devices a minute, or even more. The sheer number of tests cause wear on the tester contacts making electrical connections to the microcircuit terminals during testing. This wear dislodges conductive debris from both the tester contacts and the device under test (DUT) terminals that contaminates the testing equipment and the DUTs themselves. The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases. Test equipment in current use has an array of test contacts that mimic the pattern of the microcircuit terminal array. The array of test contacts is supported in a structure that precisely maintains the alignment of the contacts relative to each other. An alignment board or plate or template aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

One particular type of microcircuit often tested before installation has a relatively large, centrally located ground (CG) terminal on a flat, bottom surface of the microcircuit package. The microcircuit signal and power (S&P) terminals surround the CG terminal in a predetermined array. Microcircuit packages having this configuration of terminals may be called CG packages. Establishing a solid ground connection to this pad is critically important to get reliable test results. ICs are not entirely uniform in their production, so making reliable contact with this ground pad is difficult.

BRIEF SUMMARY

Embodiments disclosed herein provide a solution that addresses each of the above-mentioned problems. Embodiments disclosed herein provide a compliant ground block that is composed of simple elements, uses an elastomeric component (e.g., made of a non-conductive material), is configurable to a wide-variety of shapes and sizes, can be cleaned by existing methods without changes, is robust in a production environment, and is low-cost. In one embodiment, the compliant ground block can be composed of a stack of blades (e.g., thin contact blades made of an electrical and/or thermal conductive material). Each blade of the blades is the same as each other. Each blade is inverted with respect to its adjacent blade in a longitudinal direction of the blade or the compliant ground block. Each contact blade has an elongated aperture near the center (e.g., below a centerline of the blade in the longitudinal direction), with the elongated aperture axis perpendicular to the axis of compliance of the ground block. In one embodiment, the contact portion of the blade has raised teeth or protrusions that make good contact with the DUT and load board ground pads.

Also disclosed is a compliant ground block for a testing system for testing integrated circuit devices. The compliant ground block includes a plurality of electrically conductive blades in a side by side generally parallel relationship. The blades are configured to be longitudinally slidable with respect to each other. The block also includes an elastomer configured to retain the plurality of blades. Each blade of the plurality of blades includes a first end and a second end opposite to the first end in a longitudinal direction. The plurality of blades is arranged so that the first end of each blade of the plurality of blades is opposite to the first end of an adjacent blade in the longitudinal direction, so that the first end of one blade is adjacent to the second end of the adjacent blade. The elastomer is at least tubular (e.g., hollow or solid cylindrical) in part and non-conductive.

Also disclosed is a testing system for testing integrated circuit devices. The testing system includes a DUT and a compliant ground block. The compliant ground block includes a plurality of blades and an elastomer configured to retain the plurality of blades. Each blade of the plurality of blades includes a first end and a second end opposite to the first end in a longitudinal direction. The plurality of blades is arranged so that the first end of each blade of the plurality of blades is opposite to the first end of an adjacent blade in the longitudinal direction. The elastomer includes a non-conductive outer surface. The plurality of blades includes a conductive outer surface. A size of the compliant ground block is at least partially aligned with a ground pad of the DUT.

Also disclosed is a method of assembling and positioning a compliant ground block in a testing system for testing integrated circuit devices. The method includes arranging a plurality of electrically conductive blades of the compliant ground block so that a first end of each blade of the plurality of blades is opposite to a first end of an adjacent blade in a longitudinal direction. The first end of one blade is adjacent a second end of an adjacent blade. The second end is opposite to the first end in the longitudinal direction. The method also includes retaining the blades with an elastomer of the compliant ground block. The blades is in a side by side generally parallel relationship. The blades are configured to be longitudinally slidable with respect to each other. The elastomer is at least tubular (e.g., hollow or solid cylindrical) in part and non-conductive. The method further includes installing the compliant ground block in a housing.

BRIEF DESCRIPTION OF THE SEVERAL VIEWS OF THE DRAWINGS

References are made to the accompanying drawings that form a part of this disclosure and which illustrate embodiments in which the systems and methods described in this specification can be practiced.

Like reference numbers represent like parts throughout.

DETAILED DESCRIPTION

Figure 1A:
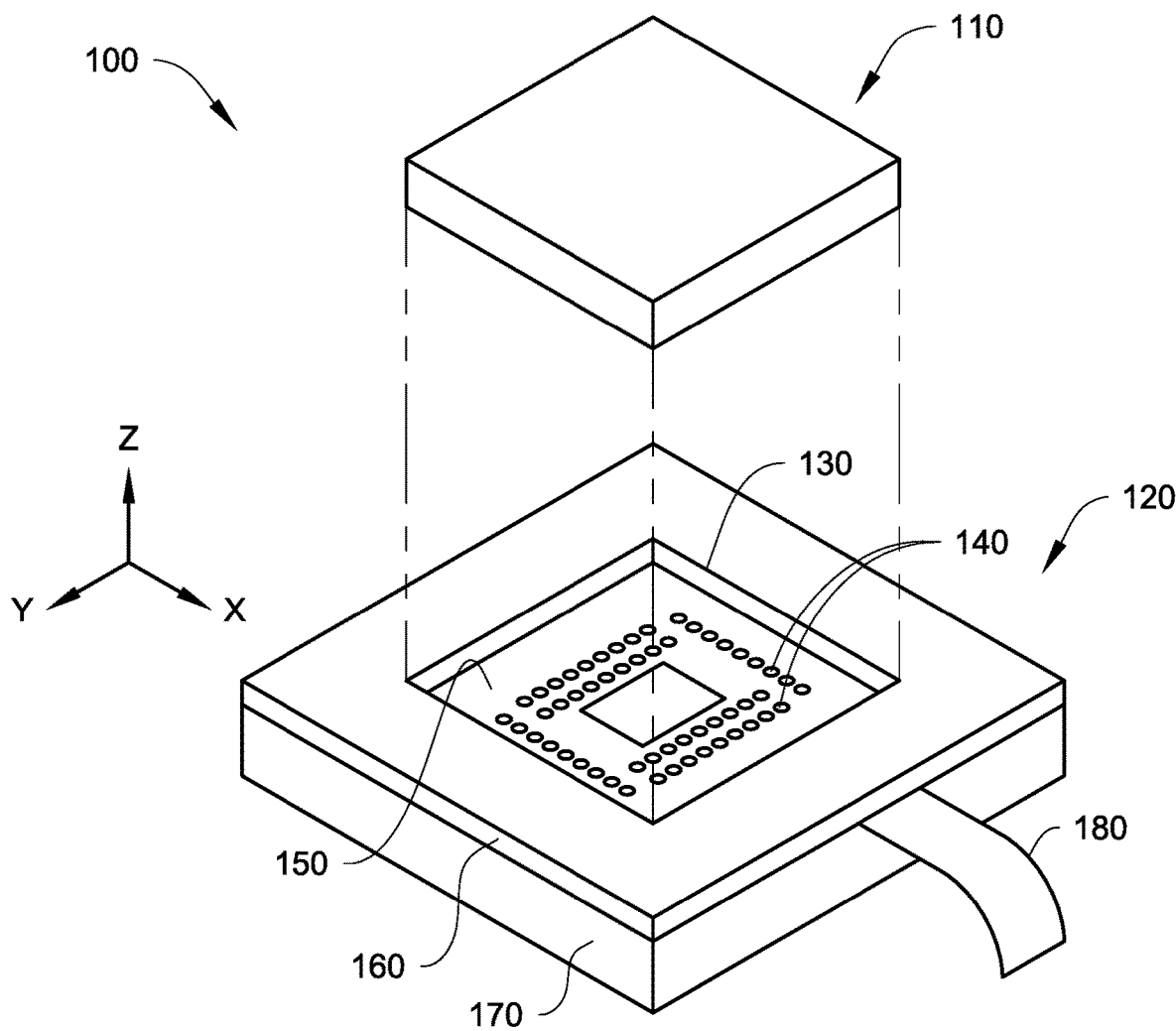
FIG. 1A is a perspective view of a part of a test system for receiving a DUT for testing, according to one embodiment.

A test contactor (i.e., a part of a test assembly including alignment plate, socket or membrane, etc.) can often provide electrical and thermal grounding to a DUT by making metal-to-metal contact to the printed circuit board (e.g., the load board) in an oversized ground contact area. It is very important that the force exerted by the ground contact in no way damages the DUT integrated circuit package or cracks the die housed within the package. A grounding system that has compliance has advantages to a non-compliant ground block because it can accommodate test handler, handler kit, and package tolerances. It will be appreciated that the term "compliance" may refer to a property of a material of undergoing elastic deformation or change in volume when subjected to an applied force. Compliance can be equal to the reciprocal of stiffness.

Typically, a few of the same compliant electrical contacts used for the S&P leads are used. Quite often, the limited space available in the ground area limits the number of signal contacts to be placed, thus reducing the electrical and thermal effectiveness of the ground. For example, a limited set of contact pins can be used in the ground area. Another approach is to install a solid block of metal (e.g., a solid copper insert) in the ground area, however that often does not work because of the complete or partial lack of compliance in the test system. In other words, the ground pad on the chip may make poor, inadequate or no contact with the ground conductor on the housing due to deviations from expected tolerances in chip package manufacture, temperature variations, misalignment by the insertion handler, etc. Another approach is to combine a metal block with compliant contact elements. This solves some of the problems in contactor grounding performance, however it adds a tremendous amount of cost to the contactor assembly. Another approach is to replace the metal ground block with a Z-axis conductive elastomer. The Z-axis conductive elastomer either has embedded wires or metallic particles suspended in the elastomer which provides the electrical and thermal ground contacts. The drawbacks of this approach is that these type of elastomers have very little usable compliance and easily get contaminated with debris. In some of these types of designs, a flexible metal layer may be added to improve the life. Another approach is the incorporation of a wedge-shaped metal blocks that are biased by a non-conductive elastomer.

Embodiments disclosed herein provide a compliant ground block for test contactors and other devices that includes, for example, a stack of plates (or blades) or other adjacent conductive elements), which in some embodiments contain an aperture that accepts an elastomer that is used as a compliant member. The aperture, in some embodiments, in the plate stack is shaped such that the compressive forces on the elastomer allow it to bulge/expand into an open cavity instead of shearing the elastomer and so that the compressive forces do not increase with deflection and make the plates immovable.

Embodiments disclosed herein provide a solution that addresses each of the above-mentioned problems. Embodiments disclosed herein provide a compliant ground block that is composed of simple elements, uses an elastomeric component (e.g., made of a non-conductive material), is configurable to a wide-variety of shapes and sizes, can be cleaned by existing methods without changes, is robust in a production environment, and is low-cost. In one embodiment, the compliant ground block can be composed of a stack of blades (e.g., thin contact blades made of an electrical and/or thermal conductive material or plating). In some embodiments, each blade of the blades is identical to lower manufacturing costs. In other embodiments, each blade of the blades may not be identical. Every other blade may have an inverted orientation with respect to its adjacent blade in a height/vertical/longitudinal direction of the blade or the compliant ground block. Each contact blade may have an elongated aperture near the center (e.g., below a centerline of the blade in the height direction), with the elongated aperture axis perpendicular to the axis of compliance of the ground block. In one embodiment, the contact portion of the blade may have raised teeth or protrusions that make good contact with the DUT and load board ground pads.

FIG. 1A is a perspective view of a part of a test system 100 for receiving a DUT 110 for testing, according to one embodiment.

The test system 100 includes a test assembly 120 for a DUT (e.g., a microcircuit, etc.) 110. The test assembly 120 includes a load board 170 that supports an alignment plate 160 having an opening or aperture 130 that precisely defines the X and Y (see the coordinate indicators X and Y, where the coordinate X is perpendicular to the coordinate Y, and the coordinate Z is perpendicular to the plane of X and Y) positioning of the DUT 110 in test assembly 120. If the DUT 110 has orientation features, it is common practice to include cooperating features in aperture 130. Load board 170 carries on its surface, connection pads connected to a cable 180 by Signal and Power (S&P) conductors. Cable 180 connects to the electronics that perform that electrical testing of the DUT 110. Cable 180 may be very short or even internal to the test assembly 120 if the test electronics are integrated with the test assembly 120, or longer if the test electronics are on a separate chassis.

A test contact array 140 having a number of individual test contact elements precisely mirrors the terminals (see 112 in FIG. 1B) carried on the surface of the DUT 110. When the DUT 110 is inserted in the aperture 130, terminals of the DUT 110 precisely align with test contact array 140. The test assembly 120 is designed for compatibility with a test contact array 140 incorporating the device. Test contact array 140 is carried on a contact membrane or sheet or socket 150. Socket 150 initially includes an insulating plastic core layer with a layer of conductive copper on each surface of the core layer. The core layer and the copper layers may each be on the order of 25 microns thick. Individual test contacts in array 140 are preferably formed on and in socket 150 using well-known photolithographic and laser machining processes. Socket 50 has alignment features such as holes or edge patterns located in the area between alignment plate 160 and load board 170 that provide for precise alignment of socket 150 with corresponding projecting features on alignment plate 160. All of the test contacts 140 are in precise alignment with the socket 150 alignment features. In this way, the test contacts of array 140 are placed in precise alignment with aperture 130.

Figure 1B:
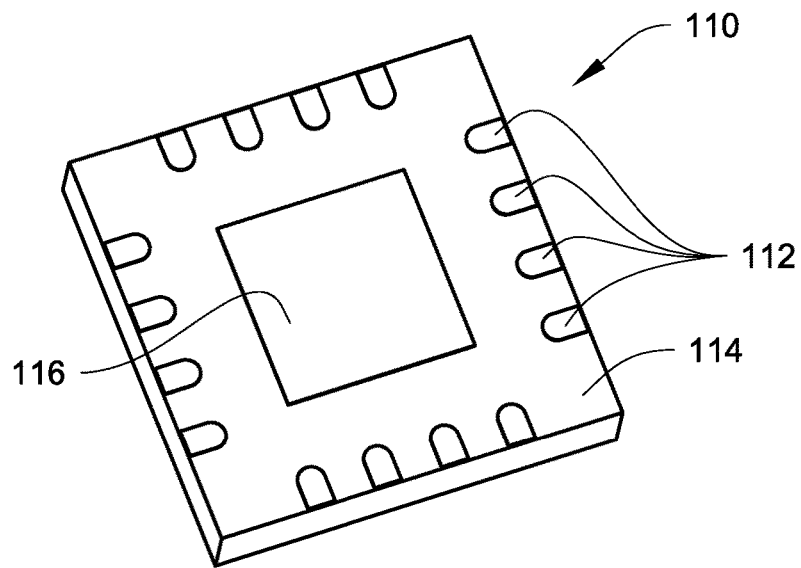
FIG. 1B is a perspective bottom view of a DUT, according to one embodiment.

FIG. 1B is a perspective bottom view of a DUT 110, according to one embodiment. The DUT (e.g., a microcircuit, etc.) 110 includes a top main surface (not shown), and a bottom main surface 114 opposite to the top main surface in the Z (see the coordinate indicators X, Y, and Z in FIG. 1A) direction. In one embodiment, the DUT 110 can have flat no-leads packages such as quad-flat no-leads (QFN) and dual-flat no-leads (DFN). Flat no-leads, also known as micro lead-frame (MLF) and SON (small-outline no leads), is a surface-mount technology, one of several package technologies that connect the DUT 110 to the surfaces of e.g., socket 150 or other printed circuit boards (PCBs) without through-holes. In one embodiment, flat no-lead can be a near chip scale plastic encapsulated package made with a planar copper lead frame substrate. Perimeter lands (e.g., terminals 112) on the package bottom provide electrical connections to the socket 150 or the PCB. Flat no-lead packages can include an exposed thermally conductive pad (e.g., the ground pad 116 in the middle of the surface 114) to improve heat transfer out of the DUT 110 (e.g., into the PCB). The QFN package can be similar to the quad-flat package (QFP) and a ball grid array (BGA).

Figure 2A:
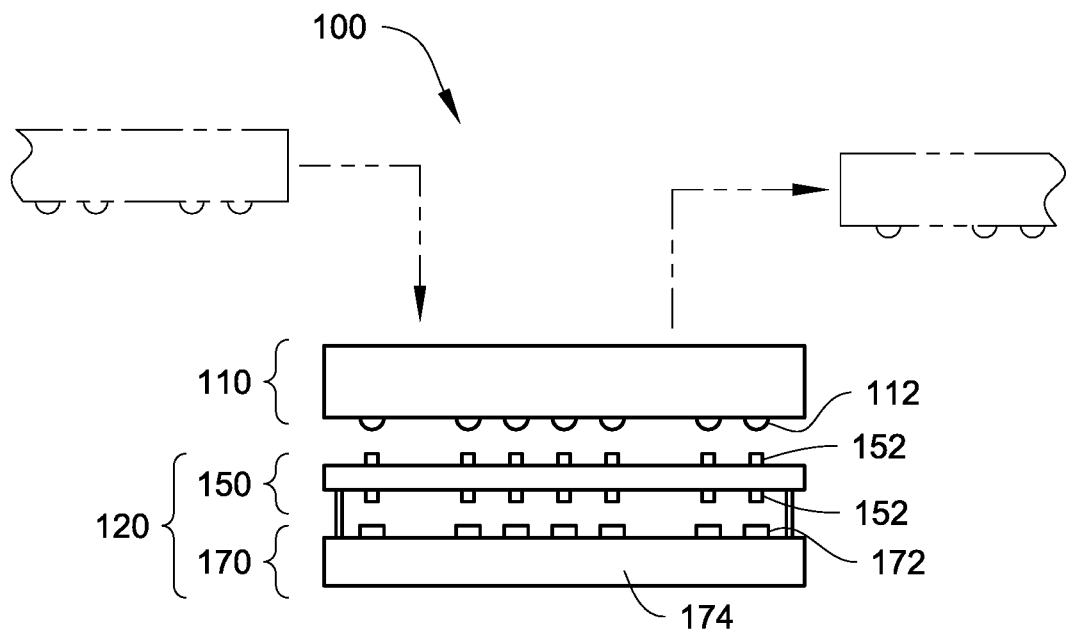
FIG. 2A is a side-view drawing of a portion of the test system for receiving a DUT for electrical testing, according to one embodiment.
Figure 2B:
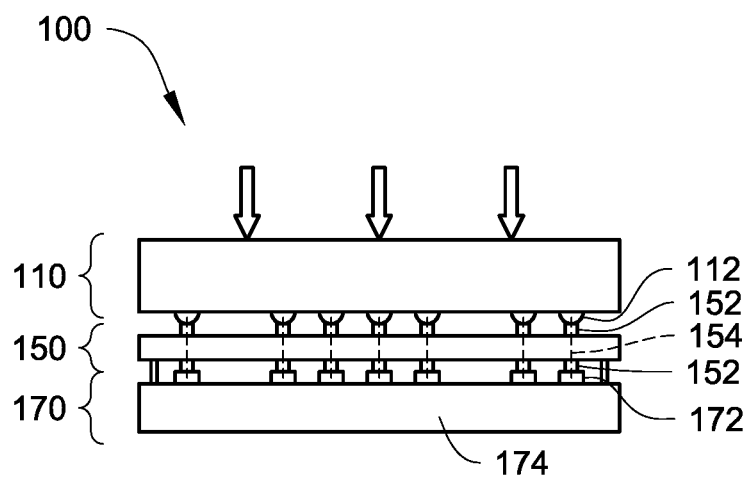
FIG. 2B is a side-view drawing of the test system of FIG. 2A, with the DUT electrically engaged, according to one embodiment.

FIG. 2A is a side-view drawing of a portion of the test system 100 for receiving the DUT 110 for electrical testing, according to one embodiment. FIG. 2B is a side-view drawing of the test system 100 of FIG. 2A, with the DUT 110 electrically engaged, according to one embodiment.

As shown in FIG. 2A, the DUT 110 is placed onto the test assembly 120, electrical testing is performed, and the DUT 110 is then removed from the test assembly 120. Any electrical connections are made by pressing components into electrical contact with other components; there is no soldering or de-soldering at any point in the testing of the DUT 110. The entire electrical test procedure may only last about a fraction of a second, so that rapid, accurate placement of the DUT 100 becomes important for ensuring that the test system 100 is used efficiently. The high throughput of the test assembly 120 usually requires robotic handling of the DUT 110. In most cases, an automated mechanical system places the DUT 110 onto the test assembly 120 prior to testing, and removes the DUT 110 once testing has been completed. The handling and placement mechanism may use mechanical and optical sensors to monitor the position of the DUT 110, and a combination of translation and rotation actuators to align and place the DUT 110 on or in the test assembly 120. Alternatively, the DUT 110 may be placed by hand, or placed by a combination of hand-fed and automated equipment.

The DUT 110 typically includes signal and power terminals 112 (see also terminals 112 of FIG. 1B) that connect to the socket 150 or other PCBs. The terminals may be on one side of the DUT 100, or may be on both sides of the DUT 110. For use in the test assembly 120, all the terminals 112 should be accessible from one side of the DUT 110, although it will be understood that there may be one or more elements on the opposite side of the DUT 110, or that there may be other elements and/or terminals on the opposite side that may not be tested by accessing terminals 112. Each terminal 112 is formed as a small, pad on button side of the DUT 110 or possibly a lead protruding from the body of the DUT 110. Prior to testing, the pad or lead 112 is attached to an electrical lead that connects internally to other leads, to other electrical components, and/or to one or more chips in the DUT. The volume and size of the pads or leads may be controlled quite precisely, and there is typically not much difficulty caused by pad-to-pad or lead-to-lead size variations or placement variations. During testing, the terminals 112 remain solid, and there is no melting or re-flowing of any solder.

The terminals 112 may be laid out in any suitable pattern on the surface of the DUT 110. In some cases, the terminals 112 may be in a generally square grid, which is the origin of an expression that describes the DUT 110, QFN, DFN, MLF or QFP for leaded parts. There may also be deviations away from a rectangular grid, including irregular spacing and geometries. It will be understood that the specific locations of the terminals may vary as needed, with corresponding locations of pads on the load board 170 and contacts on the socket 150 or housing being chosen to match those of the terminals 112. In general, the spacing between adjacent terminals 2 is in the range of 0.25 to 1.5 mm, with the spacing being commonly referred to as a "pitch". When viewed from the side, as in FIG. 2A, the DUT 110 displays a line of terminals 112, which may optionally include gaps and irregular spacing. These terminals 112 are made to be generally planar, or as planar as possible with typical manufacturing processes. In many cases, if there are chips or other elements on the DUT 110, the protrusion of the chips is usually less than the protrusion of the terminals 112 away from the DUT 110.

The test assembly 120 of FIG. 2A includes a load board 170. The load board 170 includes a load board substrate 174 and circuitry that is used to test electrically the DUT 110. Such circuitry may include driving electronics that can produce one or more AC voltages having one or more particular frequencies, and detection electronics that can sense the response of the DUT 110 to such driving voltages. The sensing may include detection of a current and/or voltage at one or more frequencies. In general, it is highly desirable that the features on the load board 170, when mounted, are aligned with corresponding features on the DUT 110. Typically, both the DUT 110 and the load board 170 are mechanically aligned to one or more locating features on the test assembly 120. The load board 170 may include one or more mechanical locating features, such as fiducials or precisely-located holes and/or edges, which ensure that the load board 170 may be precisely seated on the test assembly 120. These locating features typically ensure a lateral alignment (X, Y, see FIG. 1A) of the load board 170, and/or a longitudinal alignment (Z, see FIG. 1A) as well.

In general, the load board 170 may be a relatively complex and expensive component. The housing/test assembly 120 performs many functions including protecting the contact pads 172 of the load board 170 from wear and damage. Such an additional element may be an interposer membrane (or socket) 150. The socket 150 also mechanically aligns with the load board 170 with suitable locating features (not shown), and resides in the test assembly 120 above the load board 170, facing the DUT 110. The socket 150 includes a series of electrically conductive contacts 152, which extend longitudinally outward on either side of the socket 150. Each contact 152 may include a resilient element, such as a spring or an elastomer material, and is capable of conducting an electrical current to/from the load board 170 from/to the DUT 110 with sufficiently low resistance or impedance. Each contact 152 may be a single conductive unit, or may alternatively be formed as a combination of conductive elements. In general, each contact 152 connects one contact pad 172 on the load board 170 to one terminal 112 on the DUT 110, although there may be testing schemes in which multiple contact pads 172 connect to a single terminal 112, or multiple terminals 112 connect to a single contact pad 172. For simplicity, we assume in the text and drawings that a single contact 152 connects a single pad 172 to a single terminal 112, although it will be understood that any of the tester elements disclosed herein may be used to connect multiple contact pads 172 connect to a single terminal 112, or multiple terminals 112 to a single contact pad 172.

Typically, the socket 150 electrically connects the load board pads 172 and the bottom contact surface of the DUT 110. Although the socket 150 may be removed and replaced relatively easily, compared with removal and replacement of the load board 170, we consider the socket 150 to be part of the test assembly 120 for this document. During operation, the test assembly 120 includes the load board 170, the socket 150, and the mechanical construction that mounts them and holds them in place (not shown). Each DUT 110 is placed against the test assembly 120, is tested electrically, and is removed from the test assembly 120. A single socket 150 may test many DUTs 110 before it wears out, and may typically last for several thousand tests or more before requiring replacement. In general, it is desirable that replacement of the socket 150 be relatively fast and simple, so that the test assembly 120 experiences only a small amount of down time for socket replacement. In some cases, the speed of replacement for the socket 150 may even be more important than the actual cost of each socket 150, with an increase in tester up-time resulting in a suitable cost savings during operation.

FIG. 2A shows the relationship between the test assembly 120 and the DUTs 110. When each DUT 110 is tested, it is placed into a suitable robotic handler with sufficiently accurate placement characteristics, so that a particular terminal 112 on the DUT 110 may be accurately and reliably placed (in X, Y and Z, see FIG. 1A) with respect to corresponding contacts 152 on the socket 150 and corresponding contact pads 172 on the load board 170. The robotic handler (not shown) forces each DUT 110 into contact with the test assembly 120. The magnitude of the force depends on the exact configuration of the test, including the number of terminals 112 being tested, the force to be used for each terminal, typical manufacturing and alignment tolerances, and so forth. In general, the force is applied by the mechanical handler of the tester (not shown), acting on the DUT 110. In general, the force is generally longitudinal, and is generally parallel to a surface normal of the load board 170.

FIG. 2B shows the test assembly 120 and DUT 110 in contact, with sufficient force being applied to the DUT 110 to engage the contacts 152 and form an electrical connection 154 between each terminal 112 and its corresponding contact pad 172 on the load board 170. As stated above, there may alternatively be testing schemes in which multiple terminals 112 connect to a single contact pad 172, or multiple contact pads 172 connect to a single terminal 112, but for simplicity in the drawings we assume that a single terminal 112 connects uniquely to a single contact pad 172.

Figure 3:
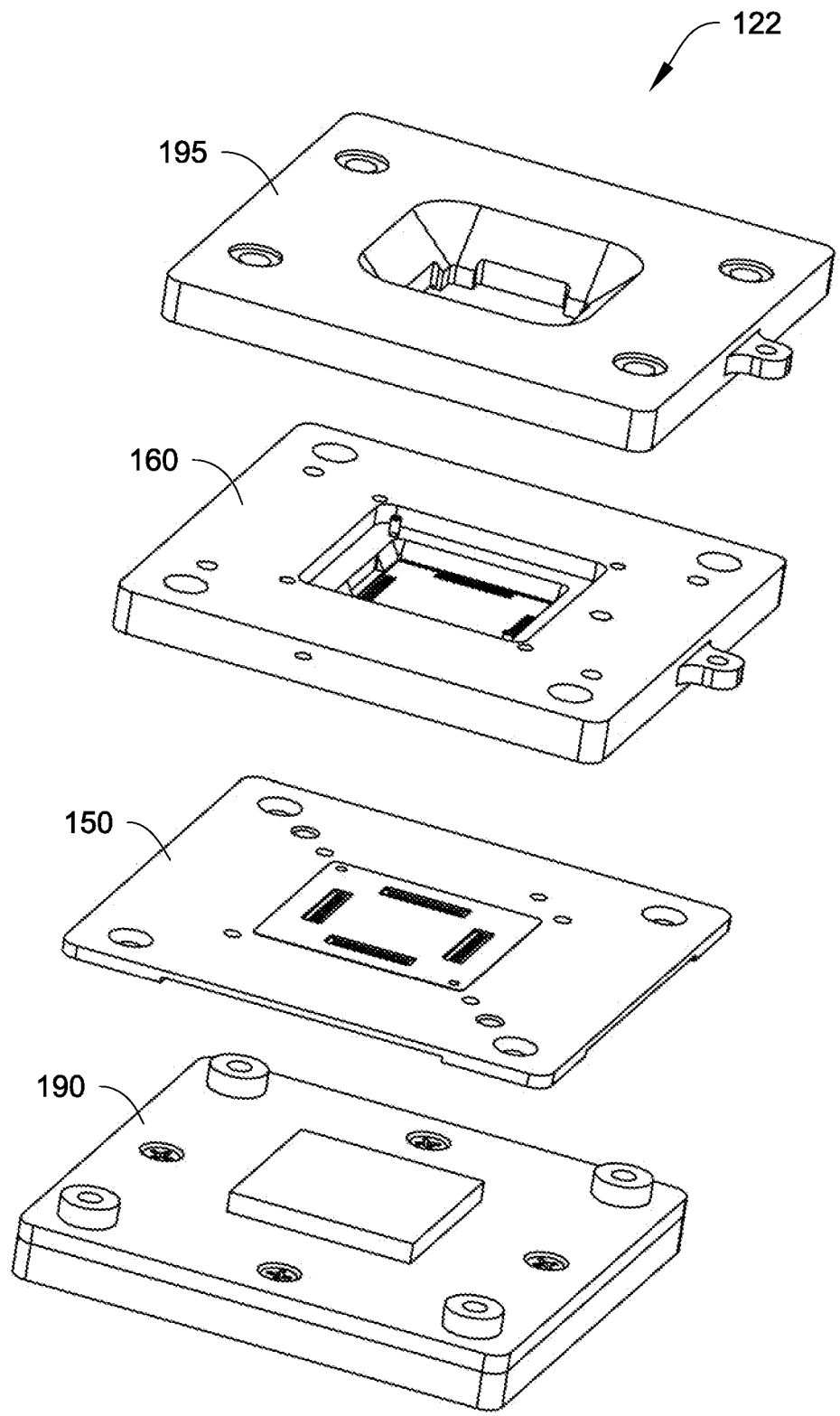
FIG. 3 is an exploded view of building blocks of a test contactor of a test assembly for the testing of a DUT, according to one embodiment.

FIG. 3 is an exploded view of the building blocks of a test contactor 122 of a test assembly 120 for the testing of a DUT, according to one embodiment. It will be appreciated that the connection assembly such as fasteners and/or parts that mount and manipulate the various building blocks of the testing assembly are not shown.

The test contactor 122 includes an optional stiffener 190, a socket (also known as membrane) 150, an alignment plate 160, and an optional clamping plate 195. The stiffener 190 can provide structural support to a load board (not shown also as known as daughter board, PCB, etc., see FIGS. 1A-2B) to minimize deflection to ensure socket 150 contacting with the load board. The load board is used to route signals from the DUT (via the socket 150) to a tester (not shown) or vice versa. The tester is used to test the DUT (e.g., by sending commands/inputs to the DUT and/or by receiving data/outputs from the DUT). The load board is mounted to a test head in the tester. In the test assembly 120, the load board is disposed between the stiffener 190 and the socket 150.

The socket 150 is used to provide a pathway for inputs/outputs of the DUT to the tester (via the load board). The device alignment plate 160 is to align the DUT to the socket 150. The alignment plate 160 is aligned and is attached to the stiffener 190 by e.g., fasteners that go through holes of the socket 150 and the load board. The alignment plate 160 has a recess/opening (e.g., in the middle of the alignment plate 150) with alignment features and a holder (e.g., Z direction up-stop) to hold the DUT and align the DUT to the socket 150 (so that the S&P pins/pads/leads/balls/lines of the DUT are aligned with the S&P pins/pads/leads/balls/lines of the socket 150).

The clamping plate 195 can be optional. The clamping plate 195 can hold the DUT firmly against the load board (via the alignment plate 160 and the socket 150) during testing. In one embodiment, vacuum (instead of the clamping plate 195) can be used as a hold down mechanism for the DUT. In another embodiment, the alignment of the DUT (by the alignment plate 160) can be made as flush as possible, and the DUT can be held at the corners rather than using a clamping plate.

Figure 4:
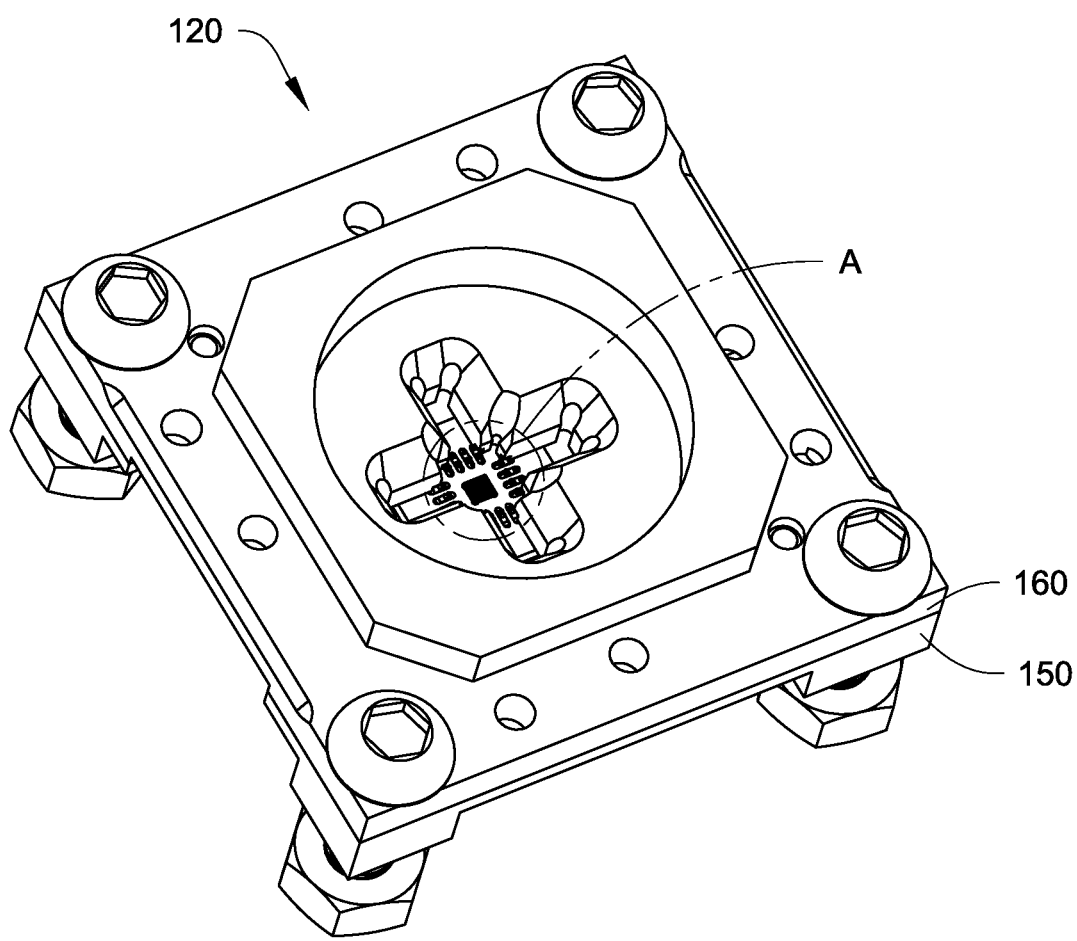
FIG. 4 is a perspective view of a test assembly, according to one embodiment.

FIG. 4 is a perspective view of a test assembly 120, according to one embodiment. The test assembly 120 includes a socket 150 and an alignment plate 160. The circled portion A of the test assembly 120 includes a housing (of the test contactor).

Figure 5A:
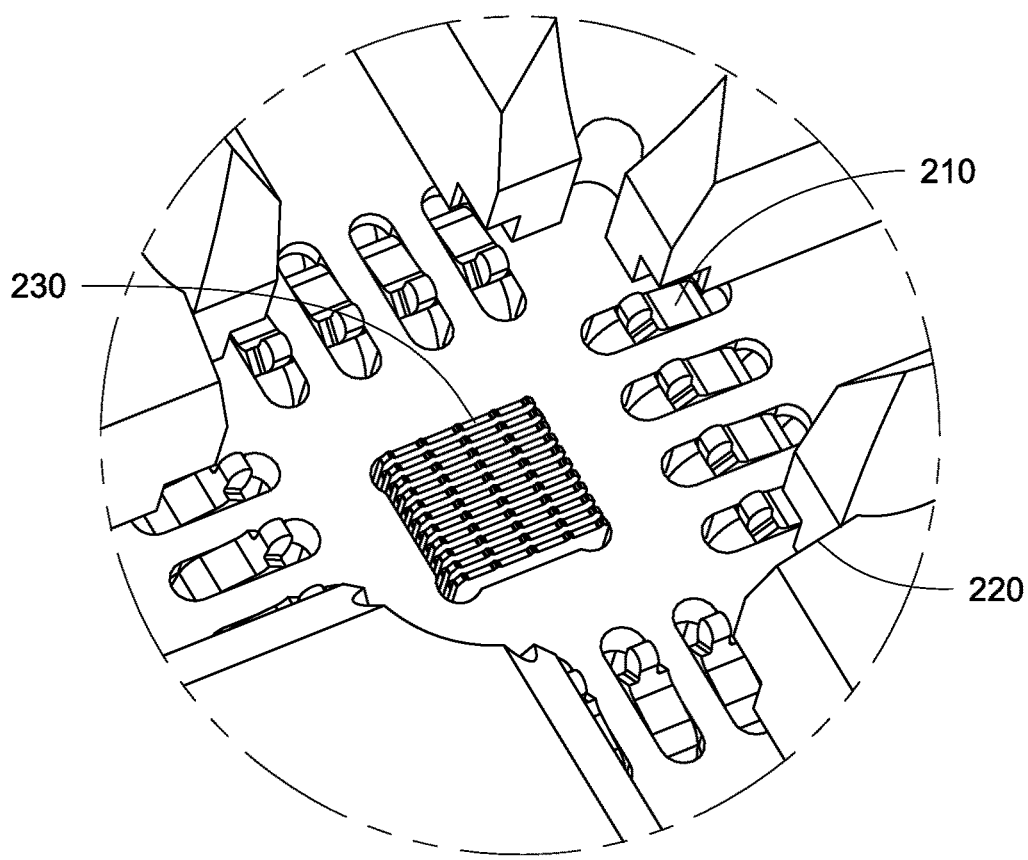
FIG. 5A is an enlarged top view of a portion of the test assembly of FIG. 4, according to one embodiment.
Figure 5B:
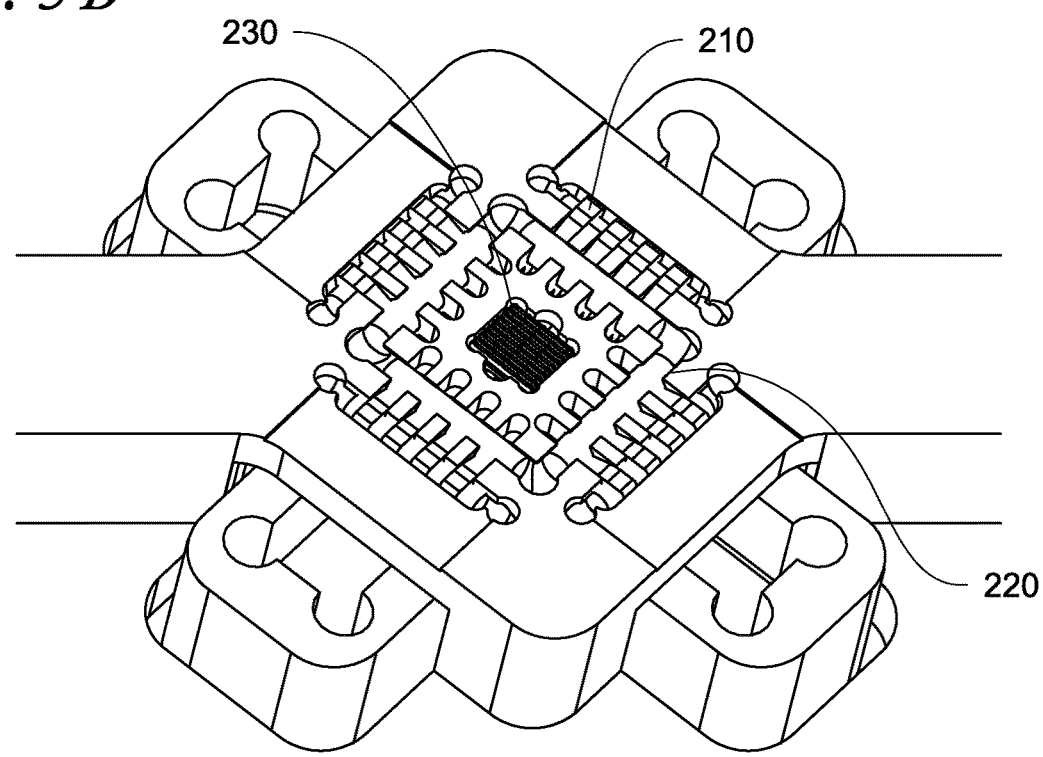
FIG. 5B is an enlarged bottom view of a portion of the test assembly of FIG. 4, according to one embodiment.

FIG. 5A is an enlarged top view of a portion (the circled portion "A") of the test assembly 120 of FIG. 4, according to one embodiment. FIG. 5B is an enlarged bottom view of a portion (the circled portion "A") of the test assembly 120 of FIG. 4, according to one embodiment.

The test contactor includes a housing 220. A plurality of S&P terminals 210 is disposed on the housing 220. The housing has an opening in e.g., a central portion of the housing, to accommodate a block 230. In one embodiment, the block 230 is a compliant ground block. It will be appreciated that in one embodiment, the size of the opening that accommodating the block 230 matches the size of the ground pad 116 of the DUT 110 (see FIG. 1B). The S&P terminals 210 align with the S&P terminals 112 of the DUT 110 (see FIG. 1B).

Figure 6A:
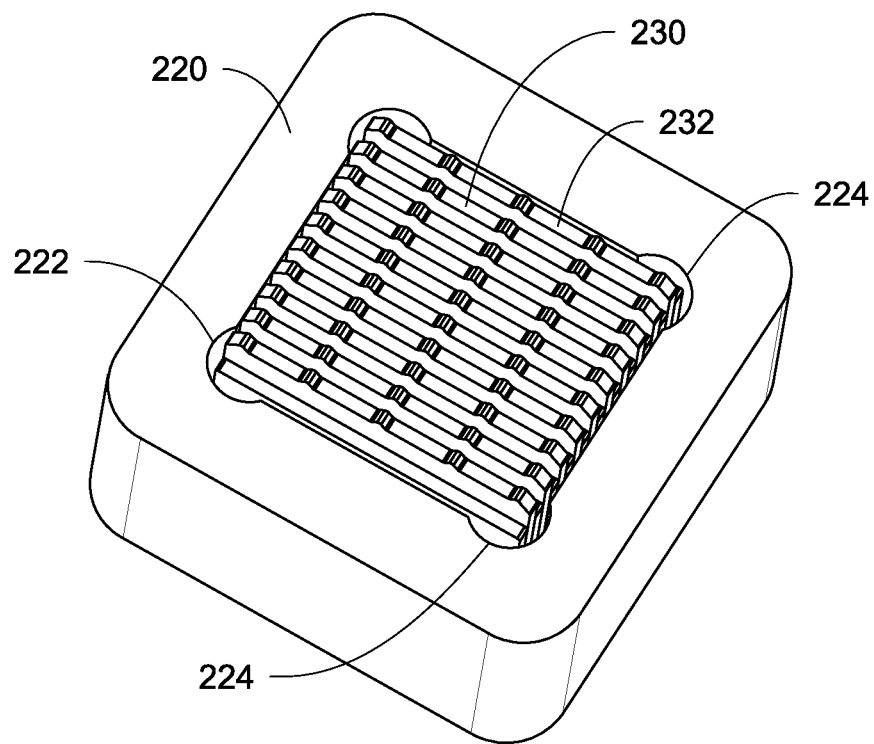
FIG. 6A is a perspective top view of a compliant ground block installed in a housing of a test contactor, according to one embodiment.
Figure 6B:
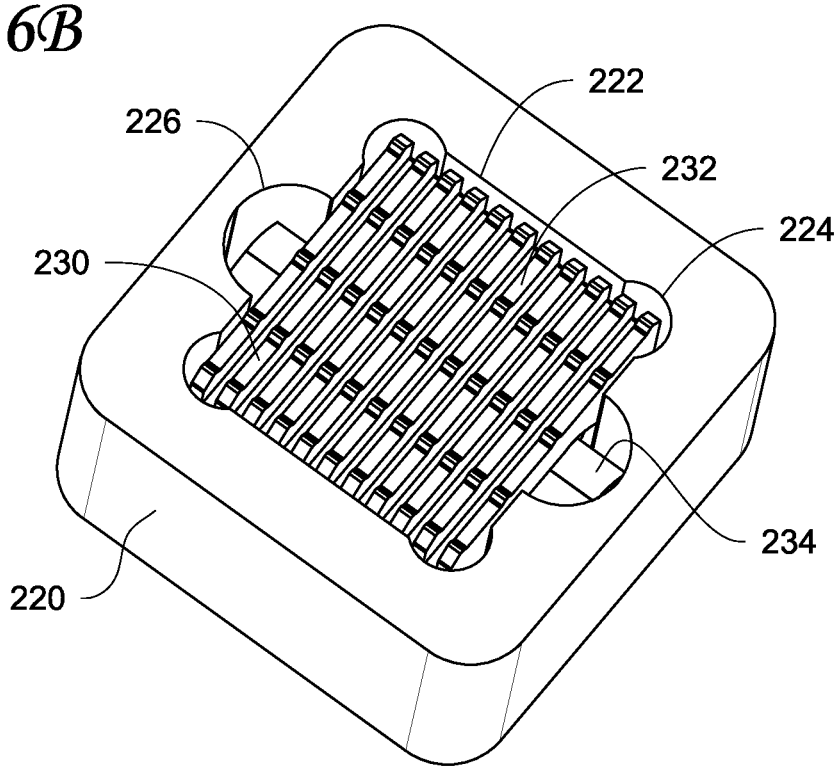
FIG. 6B is a perspective bottom view of a compliant ground block installed in a housing of a test contactor, according to one embodiment.

FIG. 6A is a perspective top view of a compliant ground block 230 installed in a housing 220 of a test contactor, according to one embodiment. FIG. 6B is a perspective bottom view of the compliant ground block 230 installed in the housing 220 of the test contactor, according to one embodiment. It will be appreciated that the housing 220 is simplified (e.g., not showing other components of the housing as shown in FIGS. 5A and 5B).

The housing 220 includes an opening 222. As shown in FIG. 6A, on the top surface of the housing 220, the opening 222 may include four circumferential curve cutouts 224 at the four corners of the opening 222. The cutouts 224 can help with preventing wear and tear caused by e.g., the sharp edges of the compliant ground block 230. The compliant ground block 230 includes a plurality (e.g., two, at or about 20, or more for contact redundancy and for a big heat sink) of blades (or plates) 232 stacked together laterally in a thickness direction (e.g., Y direction, see FIG. 1A) of the blade 232. In one embodiment, each of the blades 232 is the same as each other. A thickness of each blade is at or about 0.050 mm. A size/area of the top surface (e.g., having a rectangular or a square shape) of the compliant ground block 230 is at or about 1.1 mm². As shown in FIG. 6B, on the top surface of the housing 220, the opening 222 may include two circumferential curve cutouts 226 at sides of the opening opposite to each other in the thickness direction of the blades 232. The compliant ground block 230 includes an elastomer 234. In one embodiment, the elastomer 234 has a cylindrical shape. The elastomer 234 is wedged into the housing, thus retaining the blade stack assembly (i.e., the blades 232). In one embodiment, the diameter of the elastomer 234 is at or about 0.4 mm.

It will be appreciated that the cutouts 226 is designed to facilitate the installation of the compliant ground block 230 from e.g., the bottom side of the housing 220. It will be appreciated that on the bottom surface of the housing 220, the opening 222 can also include two circumferential cutouts 226 at sides of the opening opposite to each other in the thickness direction of the blades 232. In such embodiment, the cutouts 226 can be designed to facilitate the installation of the compliant ground block 230 from e.g., the top side of the housing 220 as well. In one embodiment, each blade 232 can be plated with e.g., gold, etc. In another embodiment, each blade 232 may not be plated if the metal of the blade is metallurgically suitable.

Figure 7A:
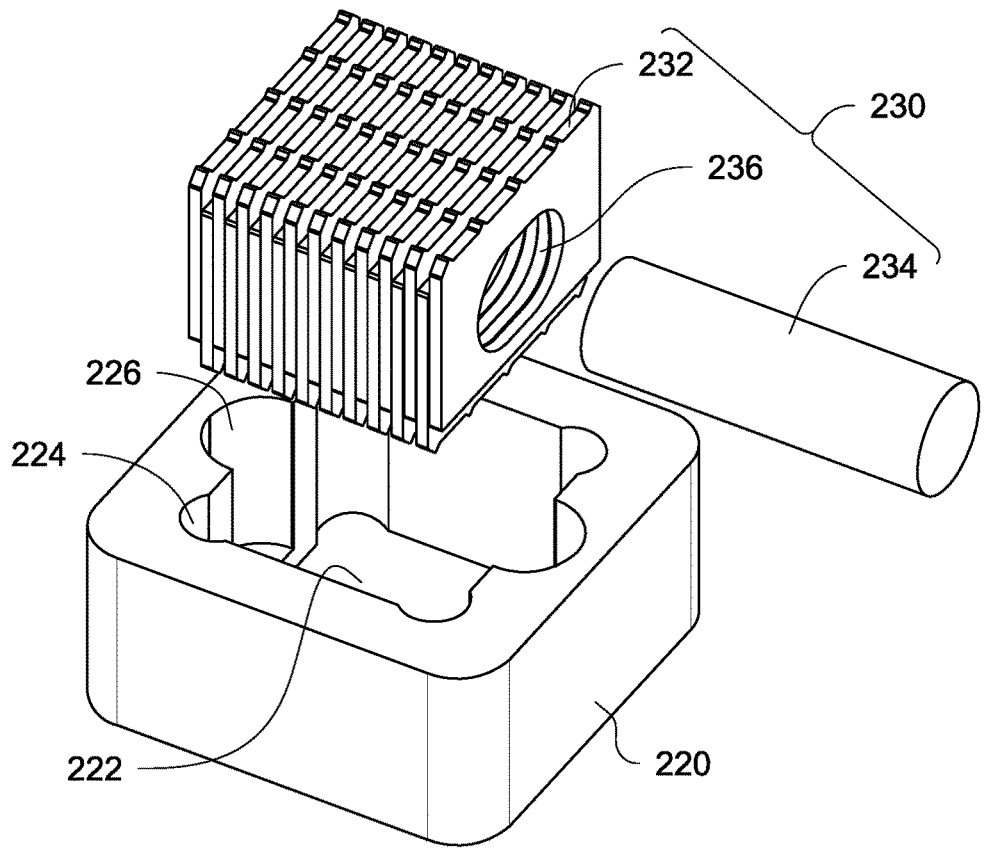
FIG. 7A is an exploded view of a compliant ground block to be installed in a housing of a test contactor, according to one embodiment.
Figure 7B:
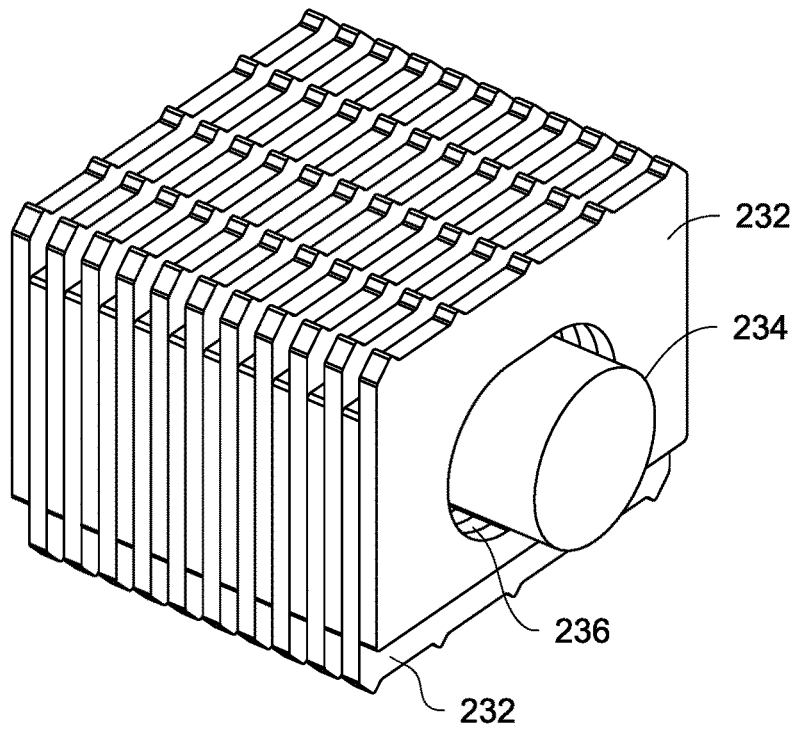
FIG. 7B is a perspective view of a compliant ground block, according to one embodiment.

FIG. 7A is an exploded view of a compliant ground block 230 to be installed in a housing 220 (showing a bottom surface of the housing) of a test contactor, according to one embodiment. FIG. 7B is a perspective view of a compliant ground block 230, according to one embodiment.

The blades 232 form an aperture 236 at or near the middle of the blades 232, which extends in the thickness direction of the blade 232. The elastomer 234 is inserted through the aperture 236 and is wedged into the housing 220, thus retaining the blades 232 in the housing 220. As shown in FIG. 7A, in one embodiment, the cutouts 224 and/or 226 may extend from the bottom surface of the housing 220 but not reach the top surface of the housing 220. In another embodiment, the cutouts 226 may extend from the bottom surface of the housing 220 to the top surface of the housing 220.

Figure 8A:
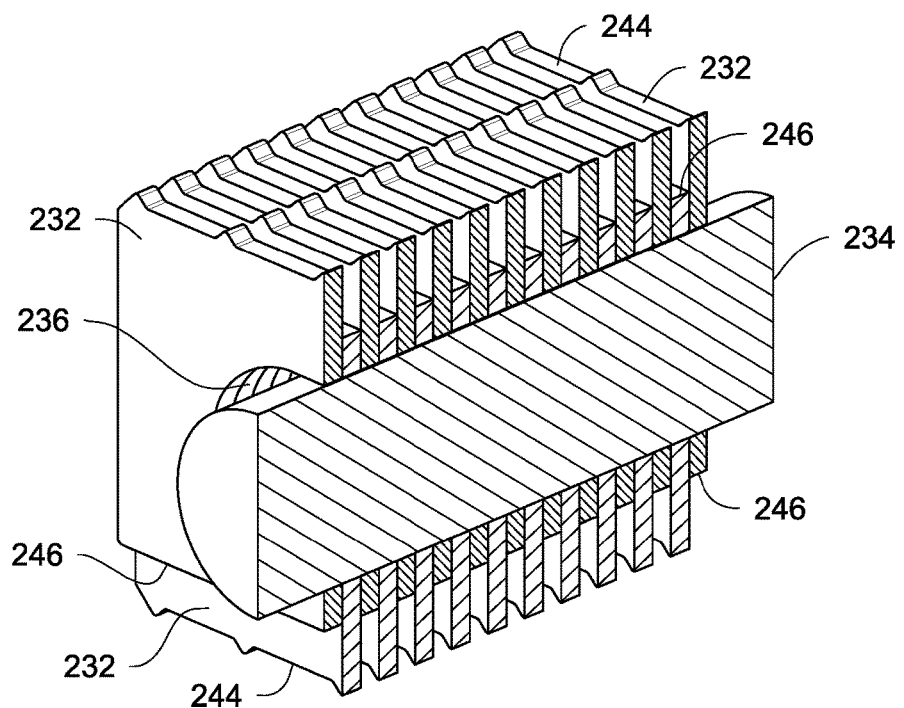
FIG. 8A is a perspective cross-sectional view of a compliant ground block in an uncompressed state, according to one embodiment.
Figure 8B:
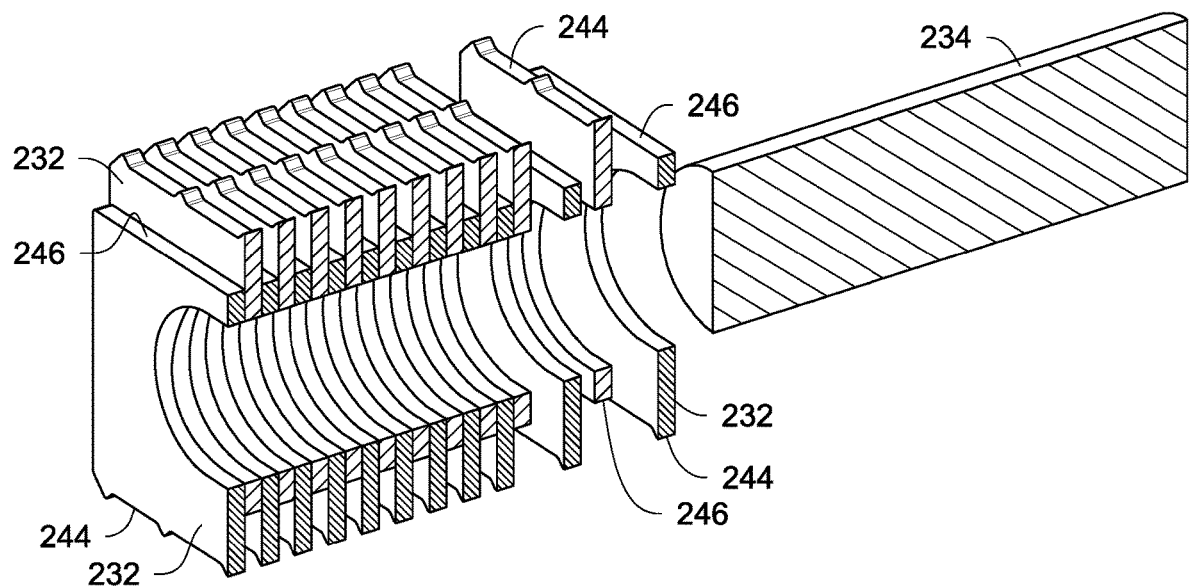
FIG. 8B is an exploded cross-sectional view of a compliant ground block in an uncompressed state, according to one embodiment.
Figure 8C:
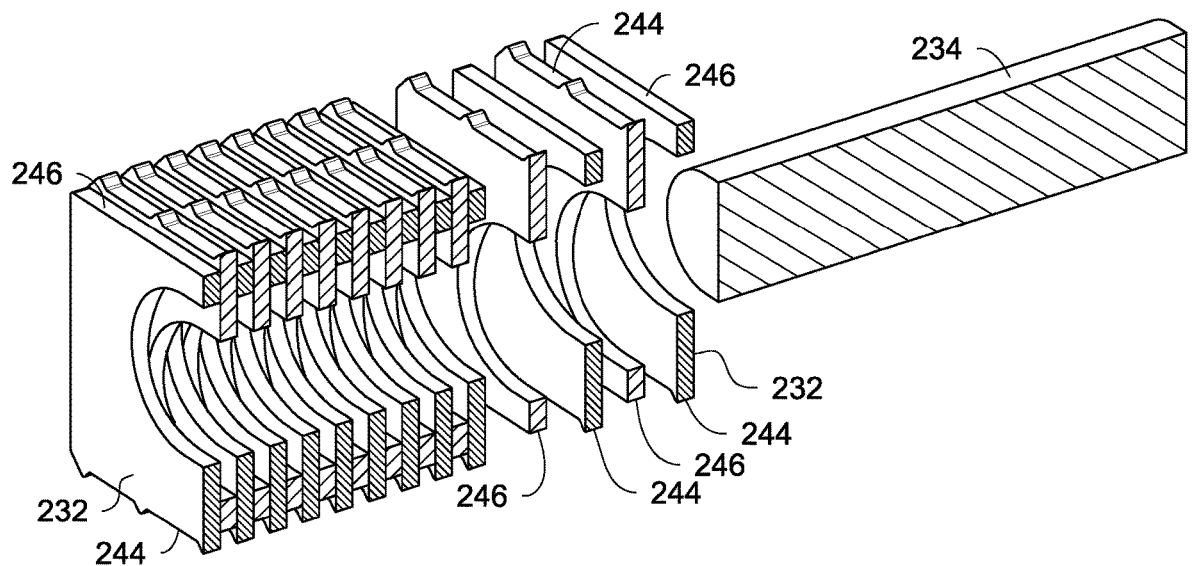
FIG. 8C is an exploded cross-sectional view of a compliant ground block in a compressed state, according to one embodiment.
Figure 8D:
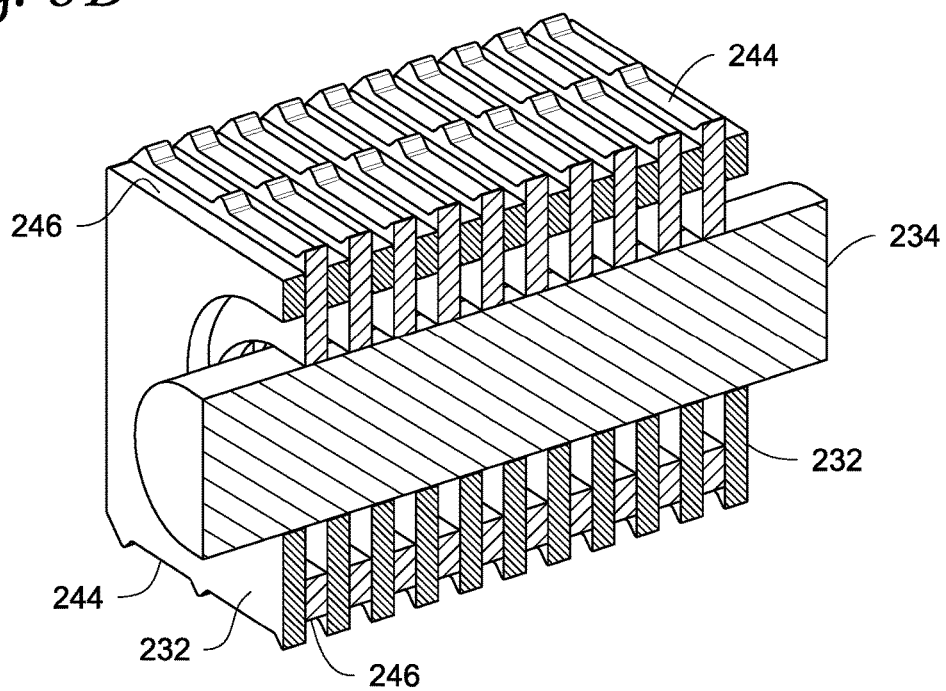
FIG. 8D is a perspective cross-sectional view of a compliant ground block in a compressed state, according to one embodiment.

FIG. 8A is a perspective cross-sectional view of a compliant ground block 230 in an uncompressed state, according to one embodiment. FIG. 8B is an exploded view of the compliant ground block 230 in the uncompressed state, according to one embodiment. FIG. 8C is an exploded view of the compliant ground block 230 in a compressed state, according to one embodiment. FIG. 8D is a perspective cross-sectional view of a compliant ground block 230 in the compressed state, according to one embodiment.

Figure 9A:
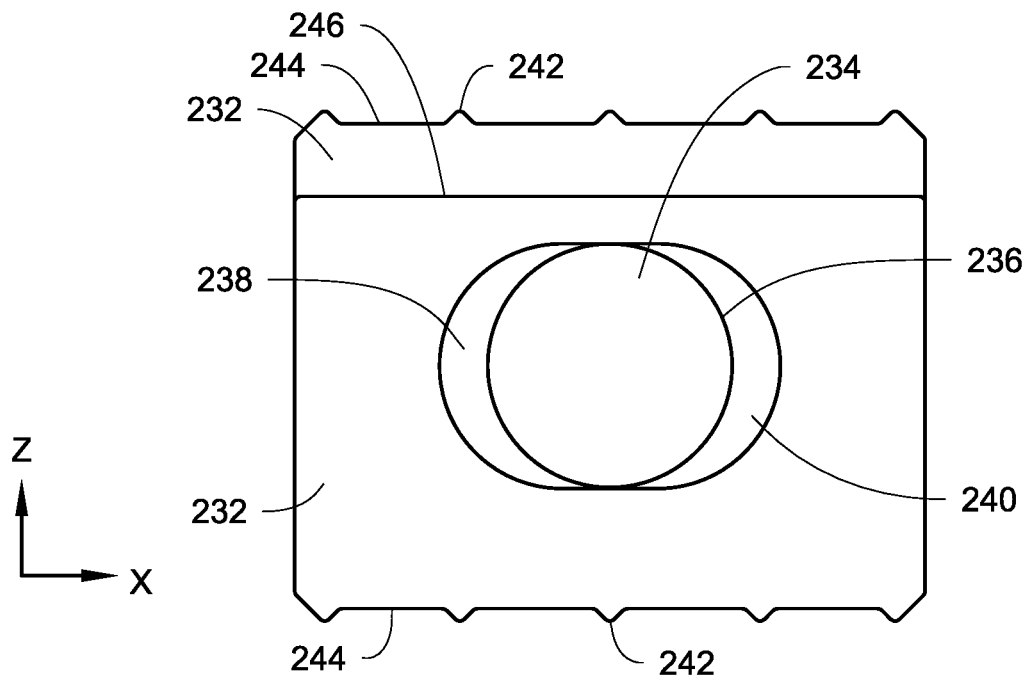
FIG. 9A is a side view of a compliant ground block in an uncompressed state, according to one embodiment.
Figure 9B:
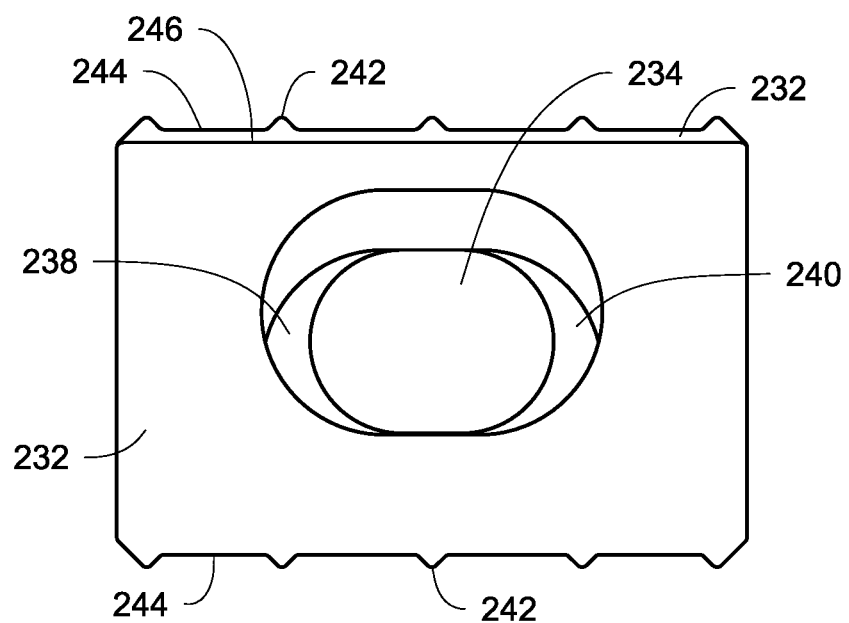
FIG. 9B is a side view of a compliant ground block in a compressed state, according to one embodiment.

FIG. 9A is a side view of a compliant ground block 230 in an uncompressed state, according to one embodiment. FIG. 9B is a side view of a compliant ground block 230 in a compressed state, according to one embodiment.

As shown in FIGS. 8A and 9A, the aperture 236 is elongated in a width/transverse direction (X direction) of the blade 232 to allow for compression of the elastomer 234. The elastomer 234 contacts the top and bottom ends of the aperture 236 in a height direction (Z direction). Cavities 238 and 240 are formed between the left and right ends of the aperture 236 in the width direction. Two blades 232 (a top 232 and a bottom 232) are shown in FIGS. 9A and 9B. Each of the blades is inverted in the height direction relative to an adjacent (adjacent in the thickness direction Y) blade. For example, each blade 232 has a first end 244 and a second end 246 opposite to the first end 244 in the height direction. The first end 244 of the bottom blade 232 is opposite to the first end 244 of the top blade 232 in the height direction. The second end 246 of the bottom blade 232 is opposite to the second end (not shown, behind the bottom blade 232 in the thickness direction) of the top blade 232. The aperture 236 is disposed at or near middle of the stacked blades 232. It will be appreciated that for each individual blade 232, the aperture 236 is disposed below a central line in the height direction and is closer to the second end 246 than to the first end 244. Each blade 232 may include a plurality of protrusions 242 at the first end 244. In one embodiment, a distance between adjacent protrusions 242 can be the same. In one embodiment, each blade can be made of any conductive material such as copper, copper alloys, nickel alloys, steels, precious metals, etc. It will be appreciated that flexibility is not a requirement with respect to the blade. Elastomer can be made of any elastic rubber-like material such as silicone, etc. In one embodiment, the elastomer may be non-conductive.

As shown in FIGS. 8D and 9B, the compliant ground block 230 is in a compressed state. The top surface of the compliant ground block 230 may contact the ground pad 116 (see FIG. 1B) of the DUT 110. The bottom surface of the compliant ground block 230 may contact the ground portion of the load board 170 (see FIG. 1). Forces exerted from both the ground pad 116 and the ground portion of the load board 170 can compress the compliant ground block 230 by compressing the elastomer 234. The round (in the cross-sectional side view in FIG. 9A) elastomer may compress perpendicularly to the compression axis (in the height direction Z) and the flow of the elastomer may move into the elongated (in the width direction X) open areas (cavities 238, 240) of the aperture 236. One advantage of such design is that the blades 232 have some freedom to gimbal over the elastomer 234 and can accommodate angular variations in the compliant ground block 230 compression into the open areas (cavities 238, 240). See e.g., FIG. 20.

Figure 10A:
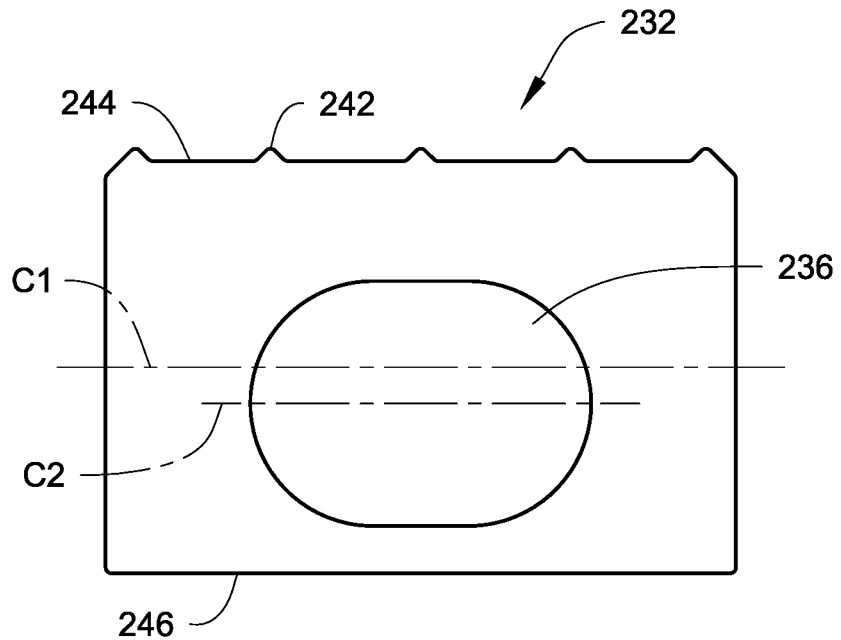
FIG. 10A is a side view of a blade, according to one embodiment.
Figure 10B:
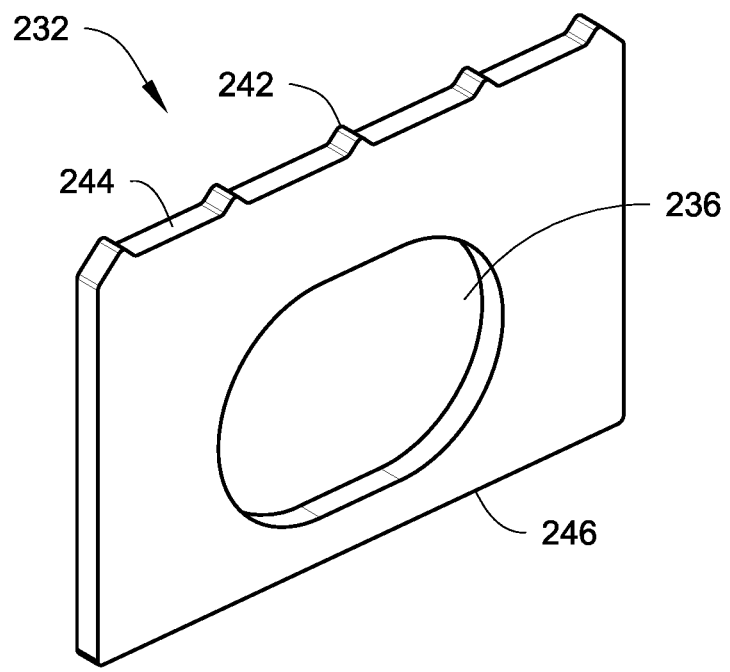
FIG. 10B is a perspective view of a blade, according to one embodiment.

FIG. 10A is a side view of a blade 232, according to one embodiment. FIG. 10B is a perspective view of a blade 232, according to one embodiment.

As shown in FIG. 10A, a central line C1 is between the first end 244 and the second 246, and has a same distance from the first end 244 and the second 246 in the height direction. A center line C2 of the aperture 236 in the height direction is disposed below C1 (i.e., C2 is closer to the second end 246 than to the first end 244). In one embodiment, each blade 232 of the stack (the compliant ground block 230) can be an identical component. In another embodiment, each blade 232 of the stack (the compliant ground block 230) may not be identical. The first end 244 of the blade 232 includes a series of small protrusions (teeth) that are contact points to the DUT pad (e.g., ground pad) or the PCB (e.g., the load board or the socket) pad (e.g., ground pad). The second end 246 of the blade 232 may be flat. The aperture 236 is an elongated (in the width direction) hole that is roughly the same diameter as the elastomer 234, but has a clearance cavity (238, 240) on either side in the width direction. The stack (the compliant ground block 230) is assembled by alternating the teeth up and down until a predetermined number of blades 232 make up the stack. The aperture 236 is centrally located laterally (in the width direction), but below center vertically (in the height direction)—thus resulting in the staggered up/down assembly (of the compliant ground block 230) and allowing for the stack compression.

Figure 11A:
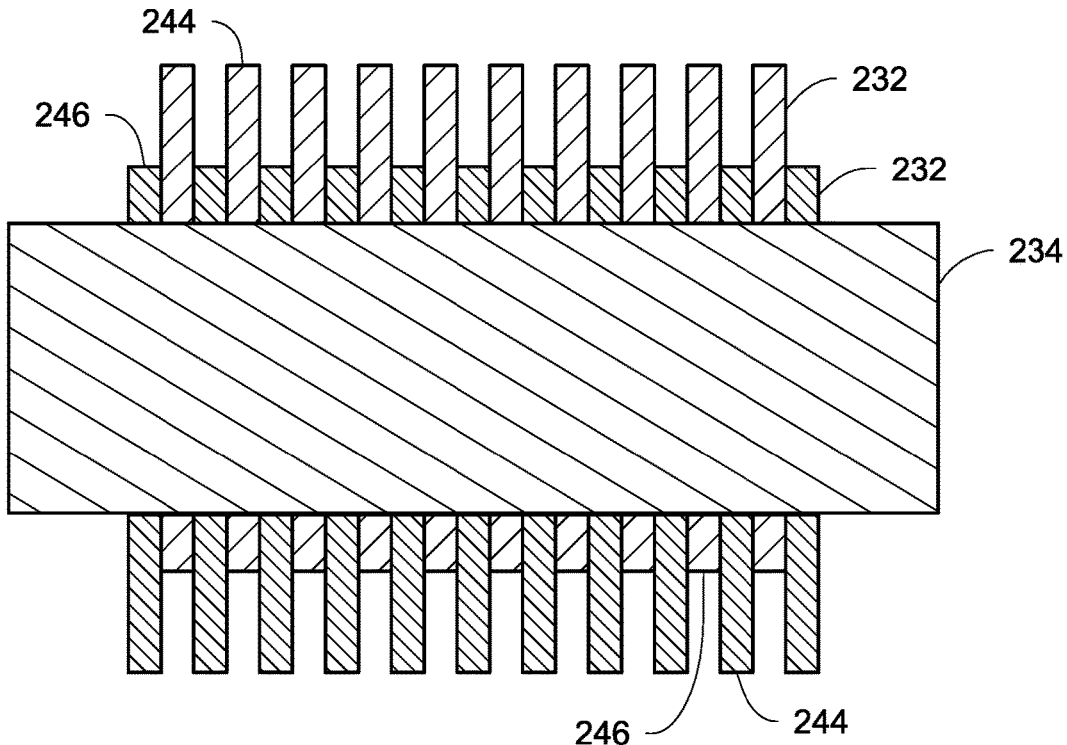
FIG. 11A is a side cross-sectional view of a compliant ground block in an uncompressed state, according to one embodiment.
Figure 11B:
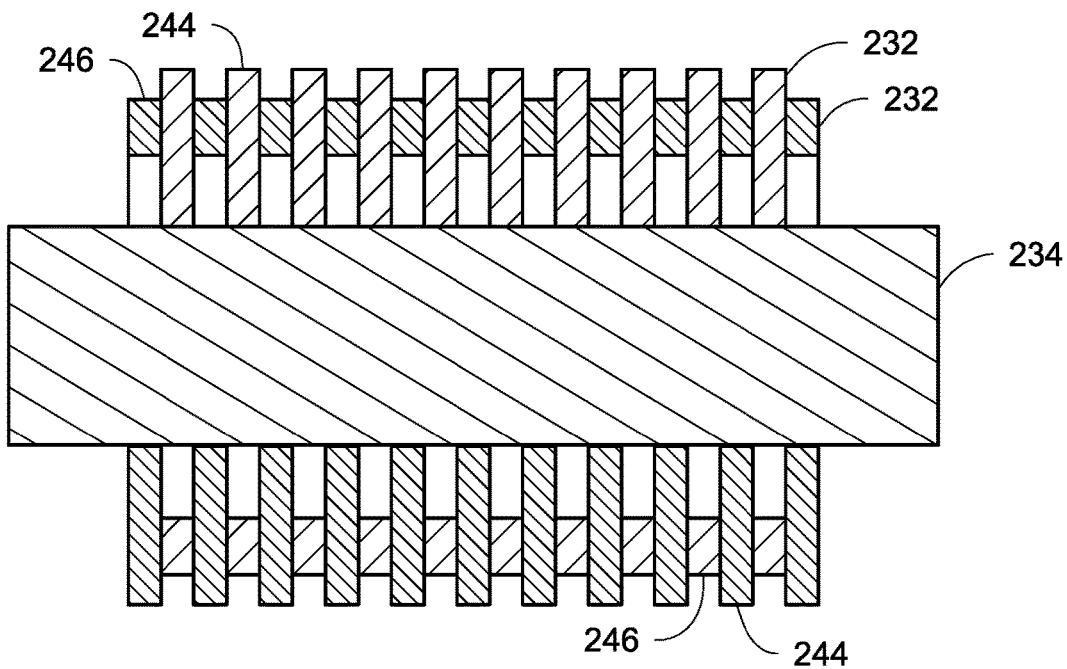
FIG. 11B is a side cross-sectional view of a compliant ground block in a compressed state, according to one embodiment.

FIG. 11A is a side cross-sectional view of a compliant ground block 230 in an uncompressed state, according to one embodiment. FIG. 11B is a side cross-sectional view of a compliant ground block 230 in a compressed state, according to one embodiment.

Compared with the uncompressed state, the first end 244 of a blade 232 is closer to the second end 246 of an adjacent (adjacent in the thickness direction Y) blade 232 in the height direction Z.

Figure 12A:
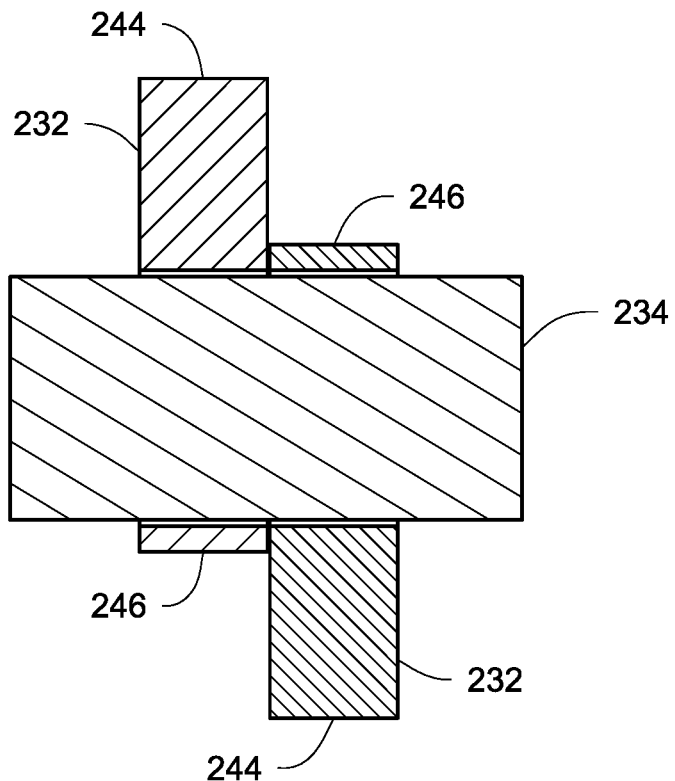
FIG. 12A is a schematic view of a compliant ground block in an uncompressed state, according to one embodiment.
Figure 12B:
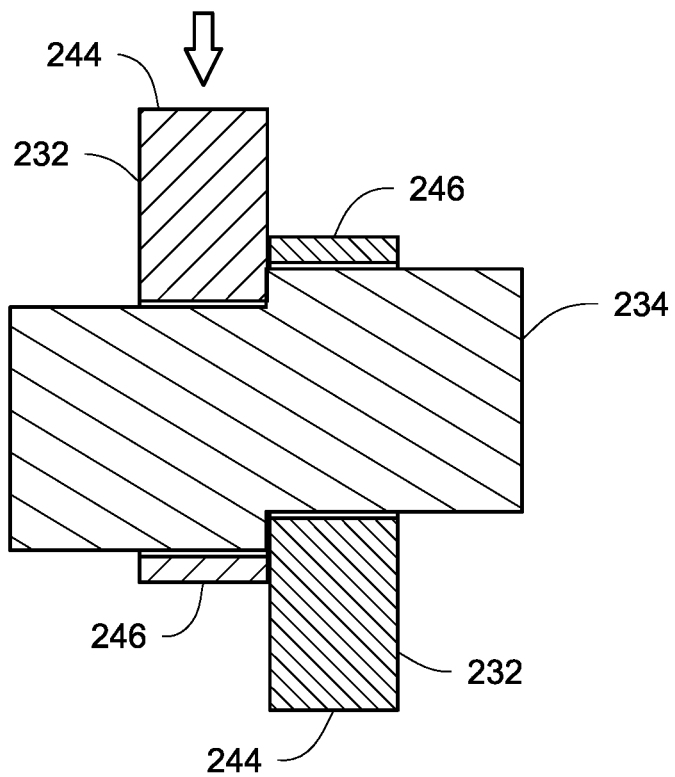
FIG. 12B is a schematic view of a compliant ground block in a compressed state, according to one embodiment.

FIG. 12A is a schematic view of a compliant ground block 230 in an uncompressed state, according to one embodiment. FIG. 12B is a schematic view of a compliant ground block 230 in a compressed state, according to one embodiment.

The compliant ground block 230 shows two blades (plates) 232 and the elastomer 234. The upper and lower blades slide up and down against each other when force is applied to compress the elastomer 234. When being compressed, the elastomer 234 installed in the aperture 236 compresses and shears. Each blade 232 slides against the mating (adjacent) blade. Some of the elastomeric resilience is taken up by a shear-type deformation of the elastomer 234.

Figure 13A:
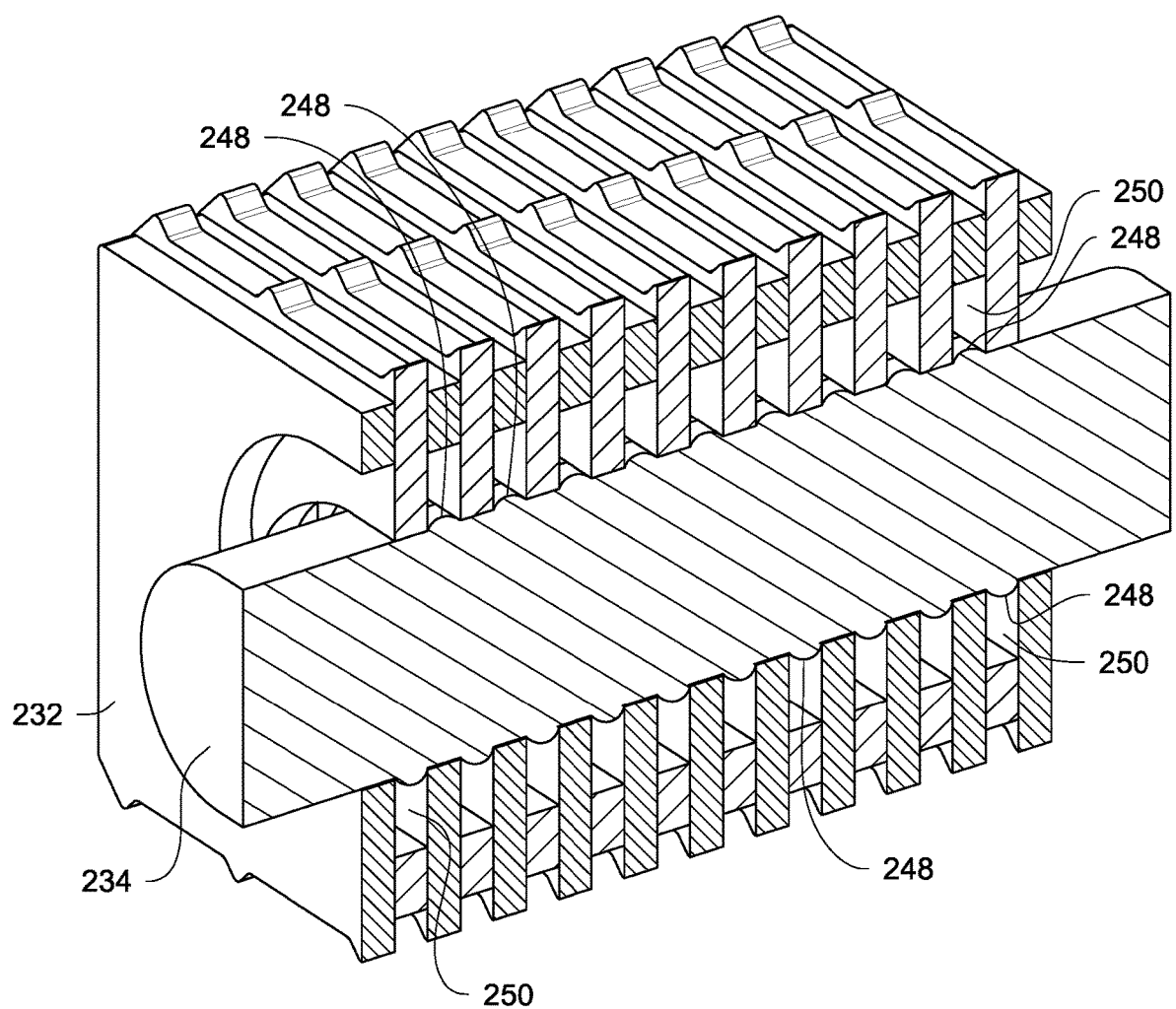
FIG. 13A is a perspective cross-sectional view of a compliant ground block in a compressed state, according to one embodiment.
Figure 13B:
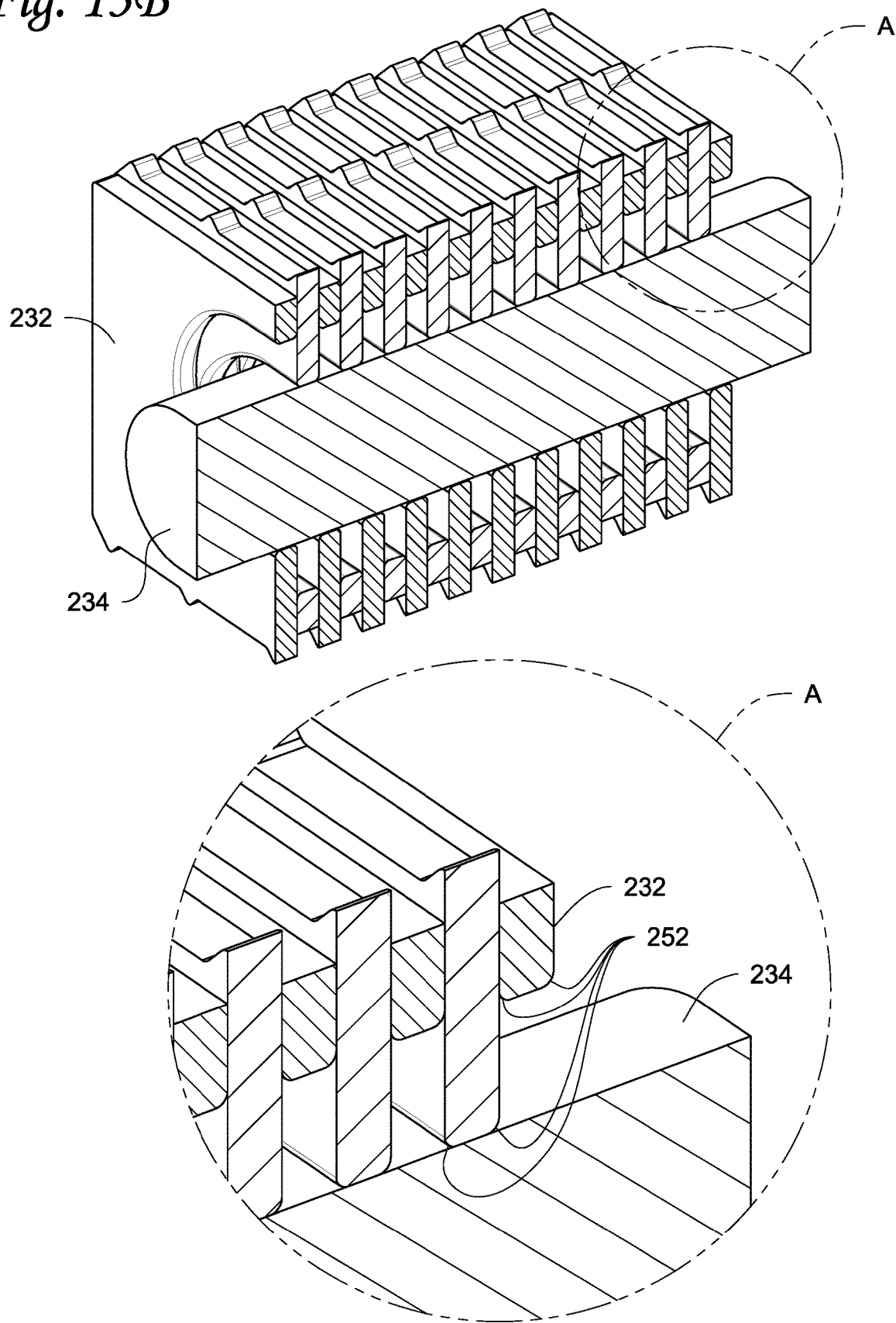
FIG. 13B is a perspective cross-sectional view of a compliant ground block, according to one embodiment.

FIG. 13A is a perspective cross-sectional view of a compliant ground block 230 in a compressed state, according to one embodiment. FIG. 13B is a perspective cross-sectional view of a compliant ground block 230, according to one embodiment.

As shown in FIG. 13A, when being compressed, the elastomer 234 also slightly bulges into the cavities 250 vacated by the opposing (adjacent) blade (see the bulges 248) in the height direction opposite to the direction of the force applied. As shown in FIG. 13B, a portion "A" of the compressed compliant ground block 230 is enlarged. The blades 232 show that the corners (see the radius 252, sized about a few microns) of the blades 232 in the thickness direction are not sharp. The non-sharp corners (the radius 252) of the blades 232 can help reducing the shearing action of the blade 232 movement, and the distributed load of the elastomer 234 causes the elastomer 234 to squeeze into the aperture cavities (238, 240).

In a larger blade stack (e.g., the compliant ground block 230), the amount of shear can be greatly reduced because the load (e.g., the force applied) is distributed over the entire length of the elastomer 234. Since the edges (in the thickness direction, see also 252) of the aperture 236 also have a slight radius, thus reducing the shearing action of the blade movement. The distributed load of the elastomer 234 causes the elastomer 234 to squeeze into the aperture cavities (238, 240). The sheer redundancy of the blades 232 can guarantee reliable electrical connection of the stack. Multiple blades 232 distribute load over elastomer 234 length, cause elastomer 234 to bulge out into open aperture cavity 250 rather than shear. Blade 232 edges (in the thickness direction) have small radius 252 that can minimize elastomer 234 cutting.

Figure 14A:
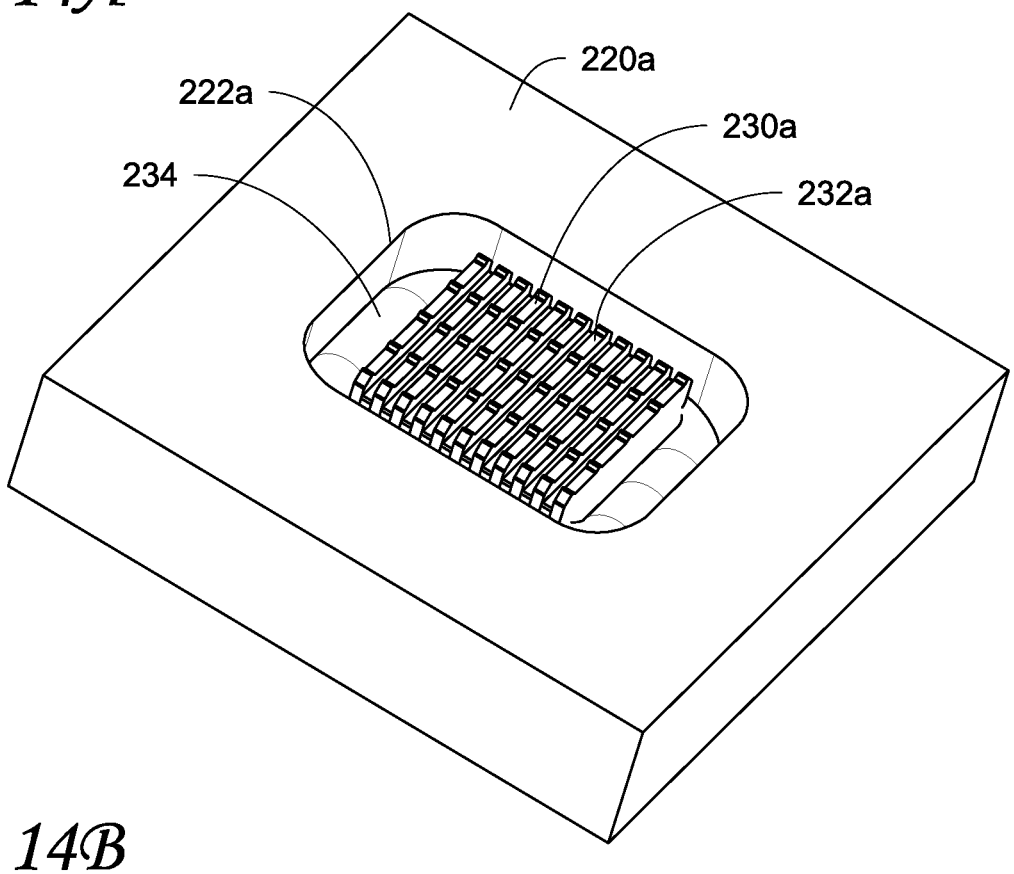
FIG. 14A is a perspective bottom view of a compliant ground block installed in a housing of a test contactor, according to one embodiment.
Figure 14B:
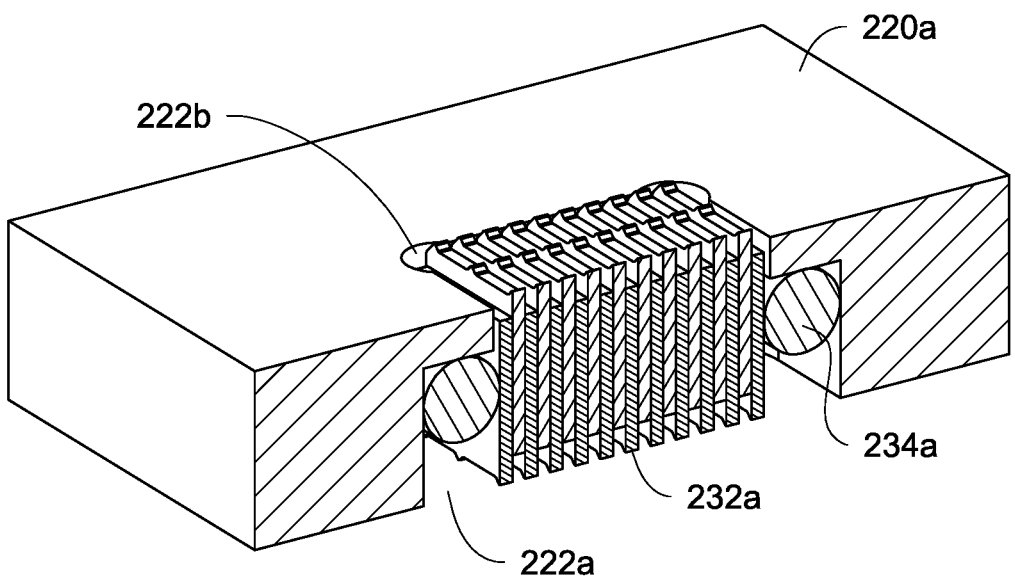
FIG. 14B is a perspective cross-sectional view of a compliant ground block installed in a housing of a test contactor, according to one embodiment.
Figure 14C:
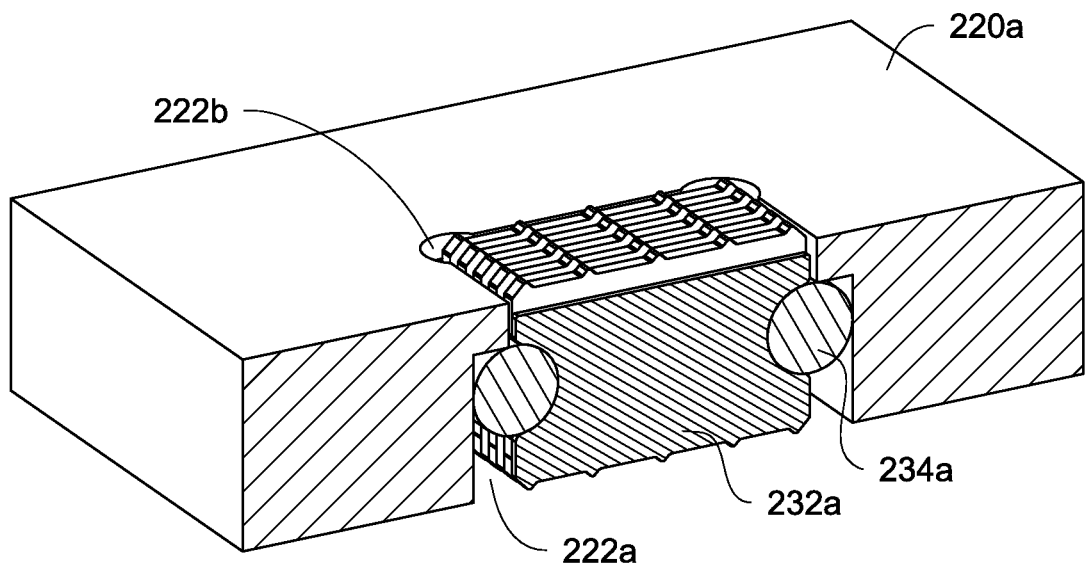
FIG. 14C is another perspective cross-sectional view of a compliant ground block installed in a housing of a test contactor, according to one embodiment.
Figure 14D:
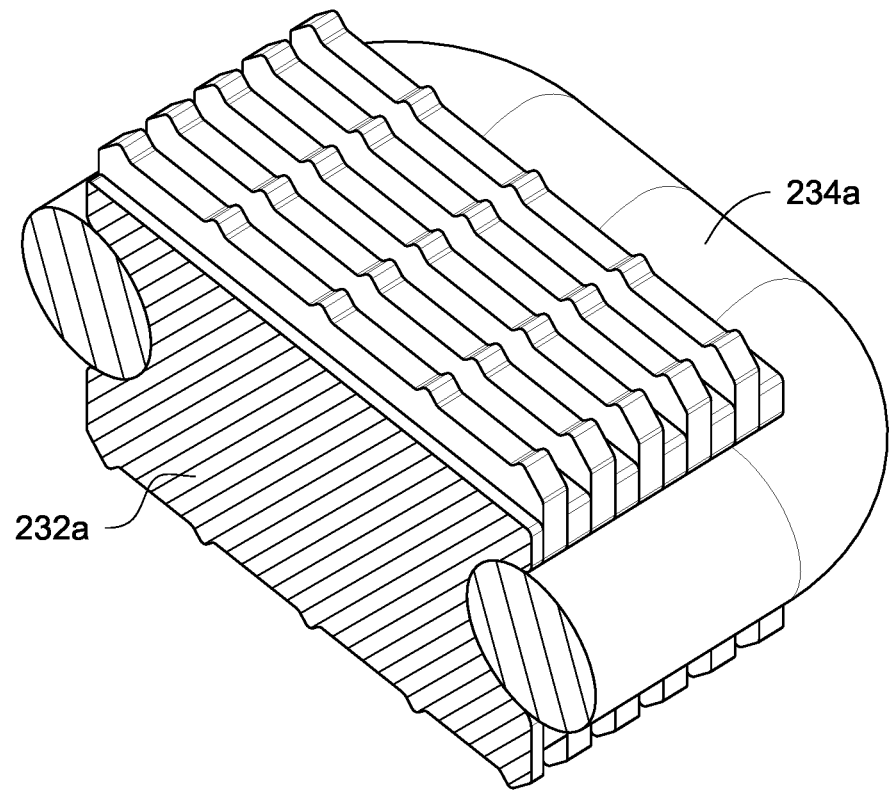
FIG. 14D is a perspective cross-sectional view of a compliant ground block, according to one embodiment.
Figure 14E:
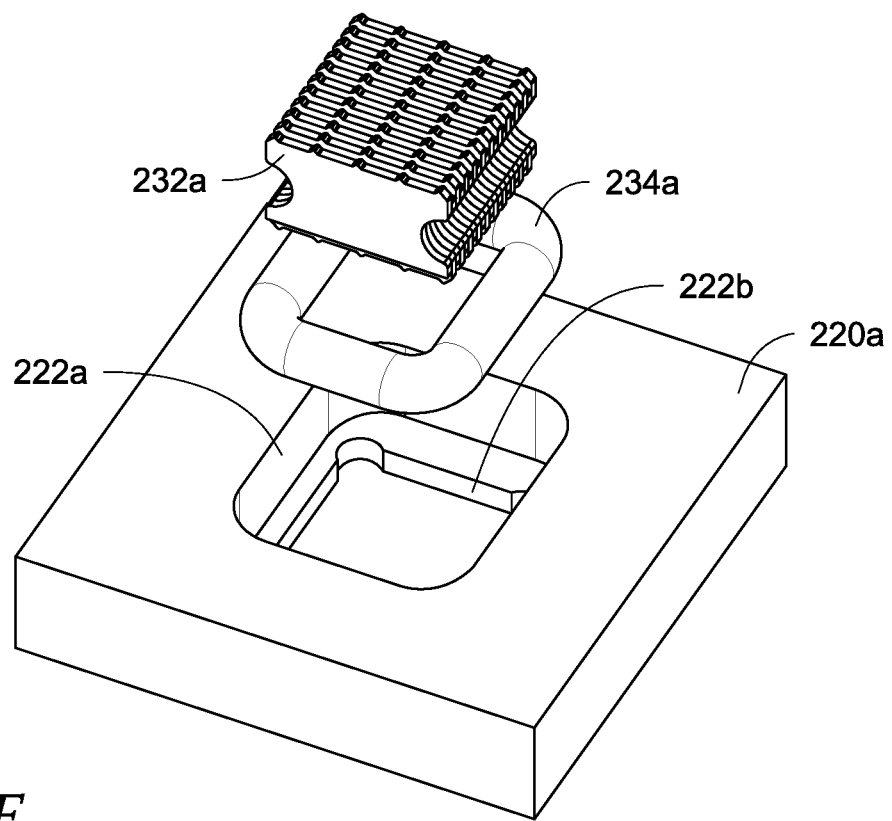
FIG. 14E is an exploded bottom view of a compliant ground block to be installed in a housing of a test contactor, according to one embodiment.
Figure 14F:
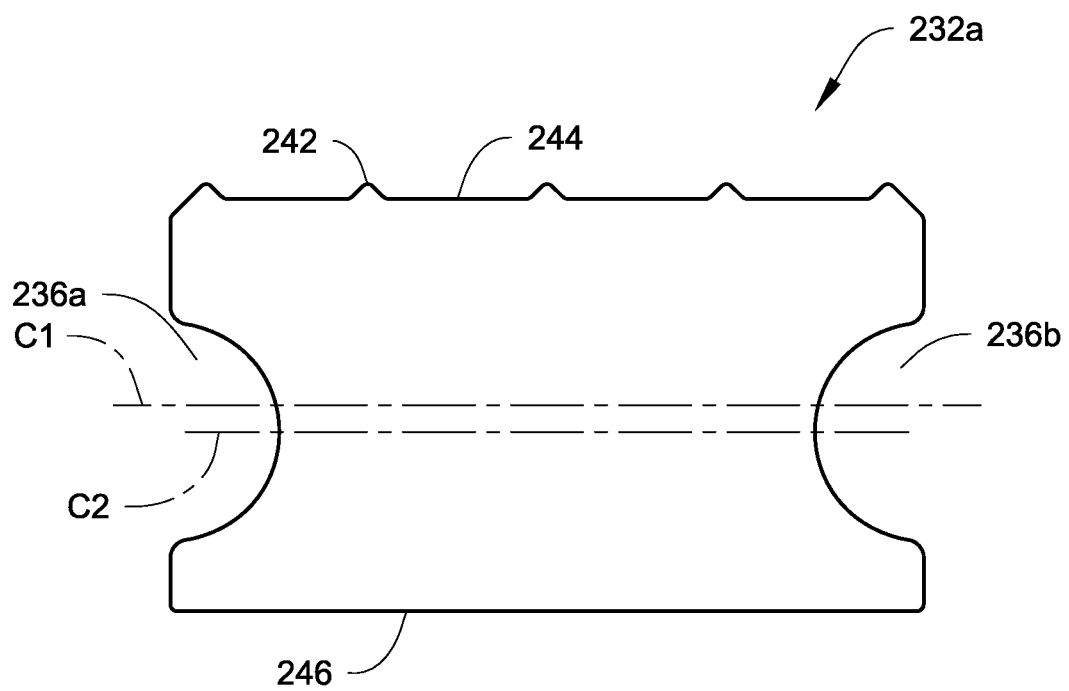
FIG. 14F is a side view of a blade, according to one embodiment.

FIG. 14A is a perspective bottom view of a compliant ground block 230a installed in a housing 220a of a test contactor, according to one embodiment. FIG. 14B is a perspective cross-sectional view of a compliant ground block 230a installed in a housing 220a of a test contactor, according to one embodiment. FIG. 14C is another perspective cross-sectional view of a compliant ground block 230a installed in a housing 220a of a test contactor, according to one embodiment. FIG. 14D is a perspective cross-sectional view of a compliant ground block 230a, according to one embodiment. FIG. 14E is an exploded bottom view of a compliant ground block 230a to be installed in a housing 220a of a test contactor, according to one embodiment. FIG. 14F is a side view of a blade 232a, according to one embodiment.

It will be appreciated that regarding FIG. 14A, the perspective top view of the compliant ground block 230a installed in the housing 220a is the same as FIG. 6A, where the elastomer is not visible. It will also be appreciated that unless explicitly described herein, the components, material, size, attributes, and/or properties, etc. of the compliant ground block 230a and/or the housing 220a are the same or similar to those of the compliant ground block 230 and/or the housing 220 described in other embodiments.

As shown in FIGS. 14A-14C and 14E, the opening 222a at the bottom surface of the housing 220a has a size that substantially matches (or for press-fit, slightly smaller than) a size of the compliant ground block 230a so that the compliant ground block 230a can be installed or inserted from the bottom of the housing 220a. The opening 222b at the top surface of the housing 220a has a size that is smaller than the size of the compliant ground block 230a to support/maintain/stop the compliant ground block 230a. The opening 222a at the bottom surface of the housing 220a extends in the height (Z) direction but does not reach the top surface of the housing 220a. The corners of the opening 222a are curved to help with preventing wear and tear caused by e.g., the sharp edges of the compliant ground block 230a.

FIG. 14B is a perspective cross-sectional view of a compliant ground block 230a installed in a housing 220a, cut in the middle of the housing 220a along the thickness (Y) direction. FIG. 14C is a perspective cross-sectional view of the compliant ground block 230a installed in the housing 220a, cut in the middle of the housing 220a along the width (X) direction.

The blade 232a has recesses (or apertures) 236a and 236b at sides of the blade 232a in the width (X) direction. The centerline C1 of the blade is above the centerline C2 of the recesses 236a and 236b. There is no opening in the middle of the blade 232a. Each blade 232a is inverted with respect to its adjacent blade 232a in the height direction. In one embodiment, the recesses 236a and 236b can have a half-circle shape. The elastomer 234a can have an O-ring or other ring shape and can be stretched around blades 232a for retention. The elastomer 234a can snap over the concave semicircular apertures 236a and 236b on both sides of the blade 232a.

Figure 15A:
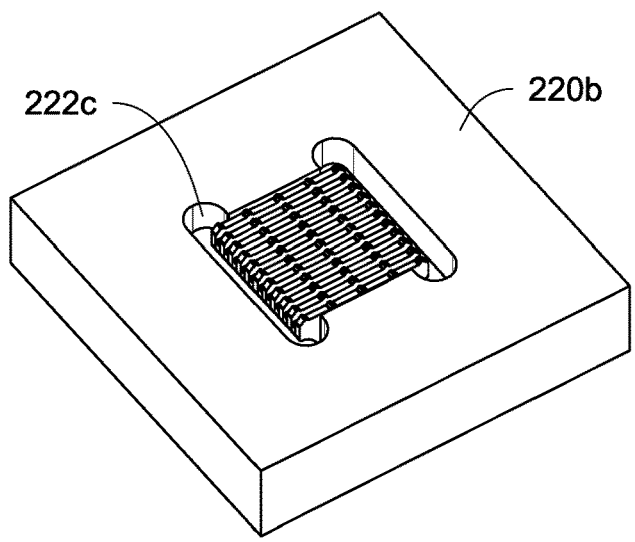
FIG. 15A is a perspective bottom view of a compliant ground block installed in a housing of a test contactor, according to one embodiment.
Figure 15B:
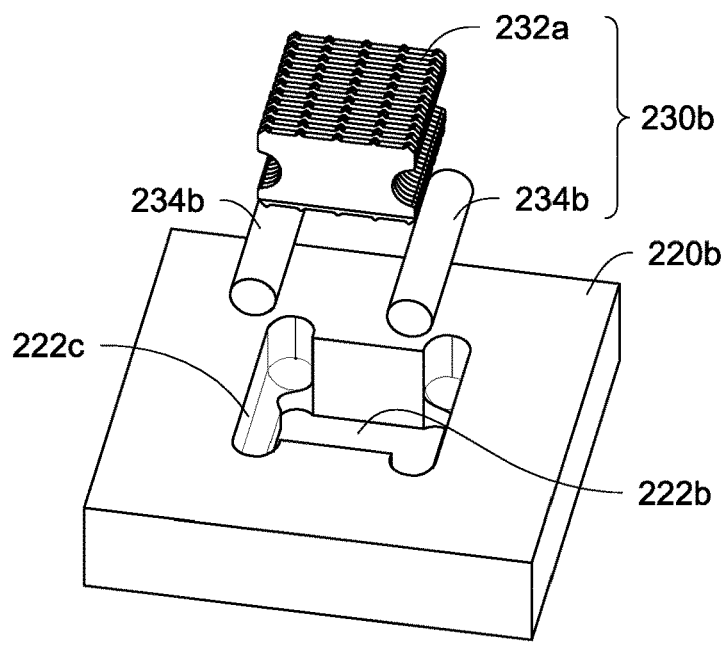
FIG. 15B is an exploded bottom view of a compliant ground block to be installed in a housing of a test contactor, according to one embodiment.
Figure 15C:
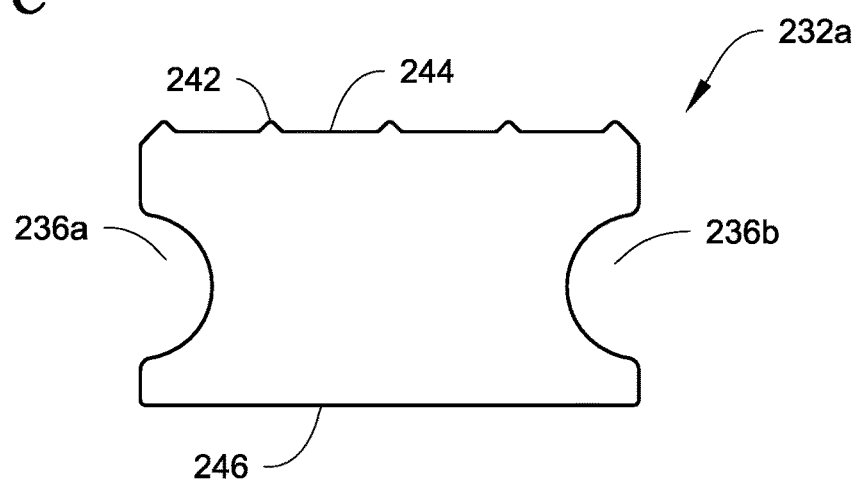
FIG. 15C is a side view of a blade, according to one embodiment.

FIG. 15A is a perspective bottom view of a compliant ground block 230b installed in a housing 220b of a test contactor, according to one embodiment. FIG. 15B is an exploded bottom view of a compliant ground block 230b to be installed in a housing 220b of a test contactor, according to one embodiment. FIG. 15C is a side view of a blade 232a, according to one embodiment.

It will be appreciated that regarding FIG. 15A, the perspective top view of the compliant ground block 230b installed in the housing 220b is the same as FIG. 6A, where the elastomer is not visible. It will also be appreciated that unless explicitly described herein, the components, material, size, attributes, and/or properties, etc. of the compliant ground block 230b and/or the housing 220b are the same or similar to those of the compliant ground block 230 and/or the housing 220 described in other embodiments. In one embodiment, FIG. 15C is the same as FIG. 14F.

Compared with FIGS. 14A-14E, in FIGS. 15A and 15B, two individual elastomer strips 234b are used instead of an O-ring elastomer 234a. Each of the elastomers 234b may have a cylindrical shape disposed on each side of the blades 232a in the width (X) direction. Each of the elastomers 234b extends in the thickness (Y) direction. A length of each elastomer 234b may be slightly greater than a thickness of the stacked blades 232a. The stacked blades 232a and each blade 232a in FIGS. 15A and 15B may be the same as the stacked blades 232a and each blade 232a respectively in FIGS. 14A-14E.

In FIGS. 15A and 15B, the opening 222c at the bottom surface of the housing 220b has an H-shape retention cut-outs, instead of the O-ring shape of 222a. The opening 222c has a size that substantially matches (or for press-fit, slightly smaller than) a size of the compliant ground block 230b so that the compliant ground block 230b can be installed or inserted from the bottom of the housing 220b. The opening 222b at the top surface of the housing 220b has a size that is smaller than the size of the compliant ground block 230b to support/maintain/stop the compliant ground block 230b. The opening 222b at the bottom surface of the housing 220b extends in the height (Z) direction but does not reach the top surface of the housing 220b. The corners of the opening 222b are curved to help with preventing wear and tear caused by e.g., the sharp edges of the compliant ground block 230b.

Figure 16A:
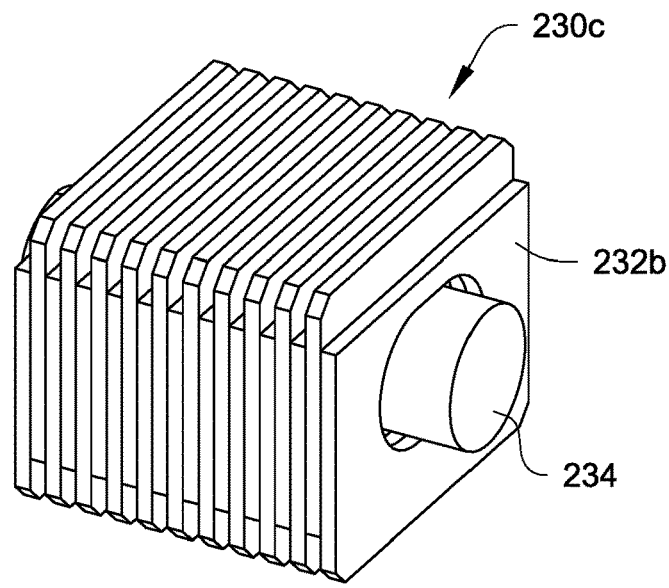
FIG. 16A is a perspective view of a compliant ground block in an uncompressed state, according to one embodiment.
Figure 16B:
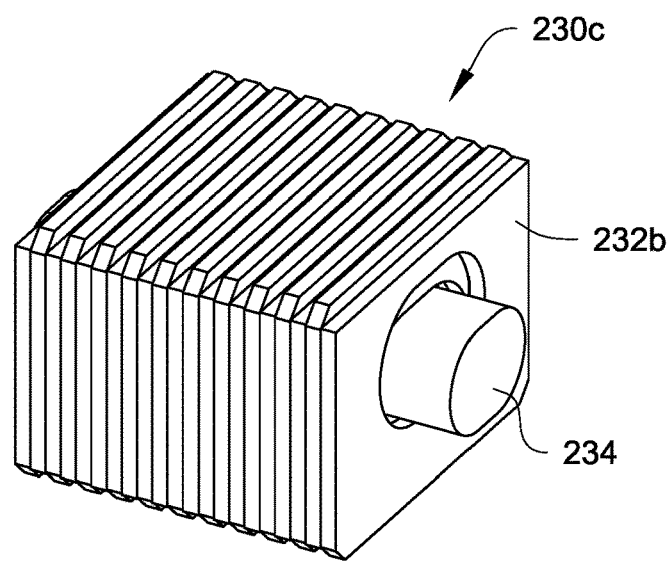
FIG. 16B is a perspective view of a compliant ground block in a compressed state, according to one embodiment.
Figure 16C:
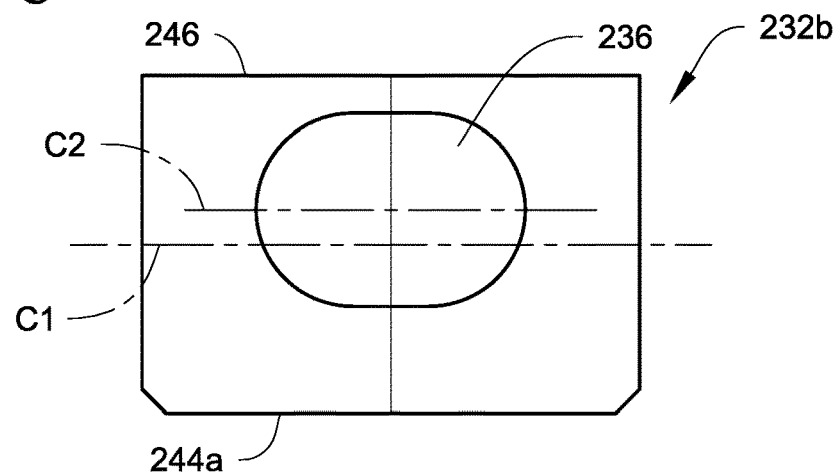
FIG. 16C is a side view of a blade, according to one embodiment.

FIG. 16A is a perspective view of a compliant ground block 230c in an uncompressed state, according to one embodiment. FIG. 16B is a perspective view of the compliant ground block 230c in a compressed state, according to one embodiment. FIG. 16C is a side view of a blade 232b, according to one embodiment.

It will be appreciated that some DUT ground pad and/or PCB (load board or socket) ground pad surfaces may be very delicate. The compliant ground block 230c can help to eliminate the teeth or protrusions in each blade and can provide a gentler touch. The contact edge (e.g., the first end 244a) of the blade 232b does not include the teeth or protrusions as in the blade 232 or 232a. The compliant ground block 230c is designed for customer devices and/or PCB ground pads with very fragile surfaces. It will be appreciated that the flat blade 232b can be combined with a tooth-blade 232 or 232a.

As shown in FIG. 16C, the blade 232b is the same as the blade 232 of FIG. 10A, except that the first end 244a of the blade 232b is flat (without the protrusions 242). Same as the blade 232 of FIG. 10A, two or four ends/corners of the blade 232b are slightly trimmed to remove the sharp corners.

Figure 17A:
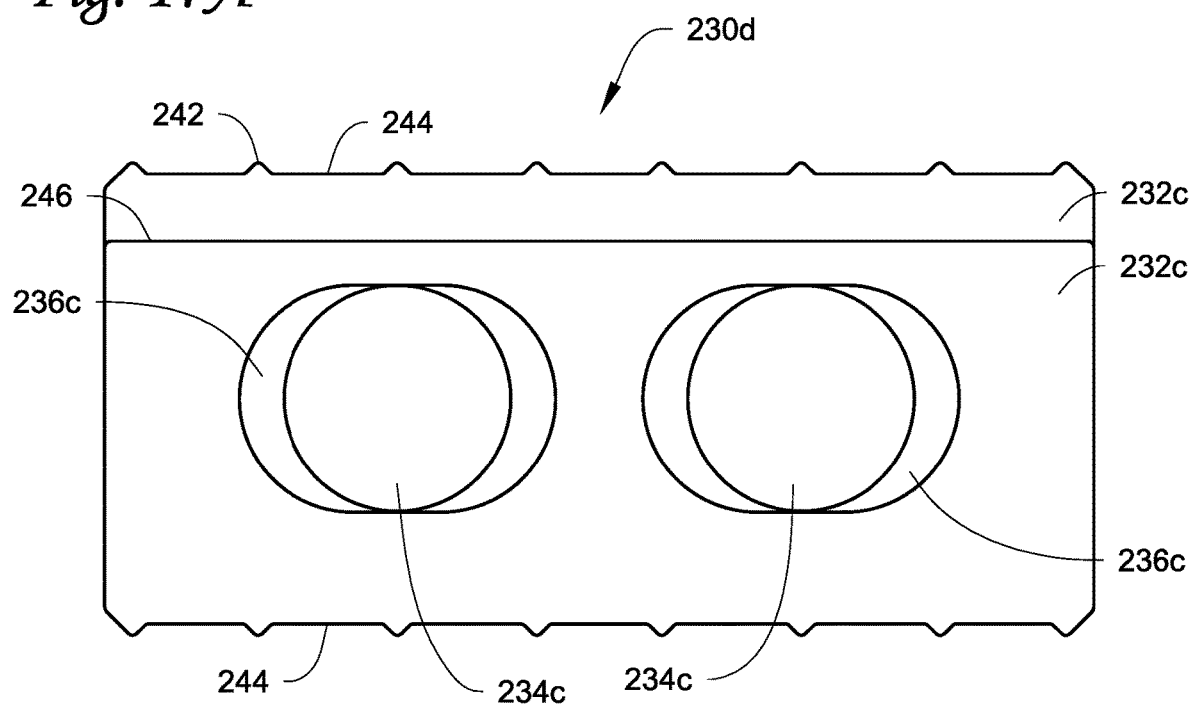
FIG. 17A is a side view of a compliant ground block in an uncompressed state, according to one embodiment.
Figure 17B:
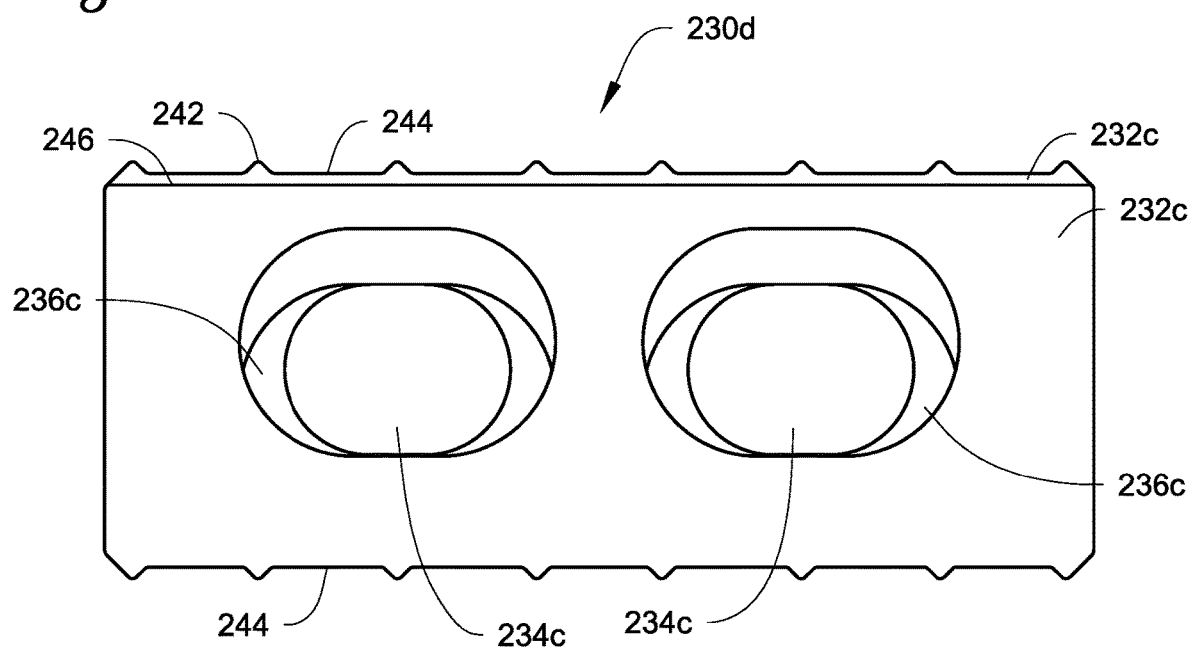
FIG. 17B is a side view of a compliant ground block in a compressed state, according to one embodiment.

FIG. 17A is a side view of a compliant ground block 230d in an uncompressed state, according to one embodiment. FIG. 17B is a side view of the compliant ground block 230d in a compressed state, according to one embodiment.

It will be appreciated that FIGS. 17A and 17B are the same as FIGS. 9A and 9B, except that each blade 232c has two or more apertures 236c. Each aperture 236c accommodate an elastomer 234c. It will also be appreciated that large DUT or PCB ground pads can be accommodated by a compliant ground block 230d that uses two or more elastomers. Such embodiment can provide additional stability. The blade 232c can be divided equally in the width (X) direction based on the number of the apertures 236c. Each aperture 236c is centrally located laterally (in the width direction) in each division of the blade 232c, but below center vertically (in the height direction). For example, as shown in FIGS. 17A and 17B, each blade 232c has two apertures 236c. The blade 232c can be divided into two parts along the width direction. Each aperture 236c is centrally located laterally (in the width direction) in each part of the blade 232c, but below center vertically (in the height direction) of that part.

Figure 18A:
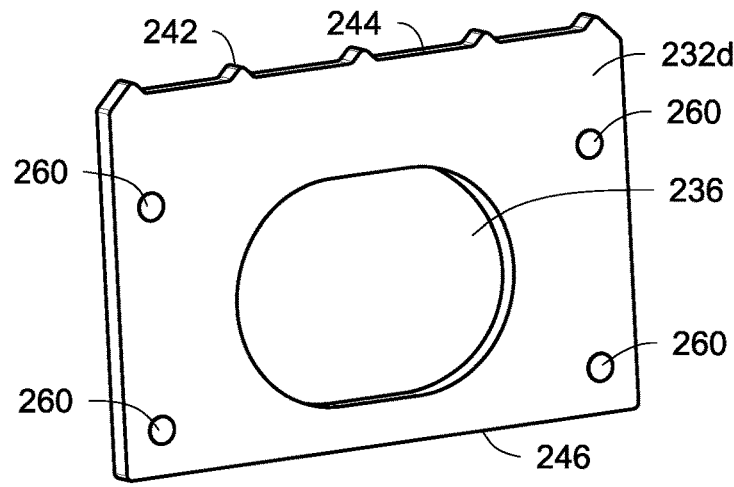
FIG. 18A is a perspective view of a blade, according to one embodiment.
Figure 18B:
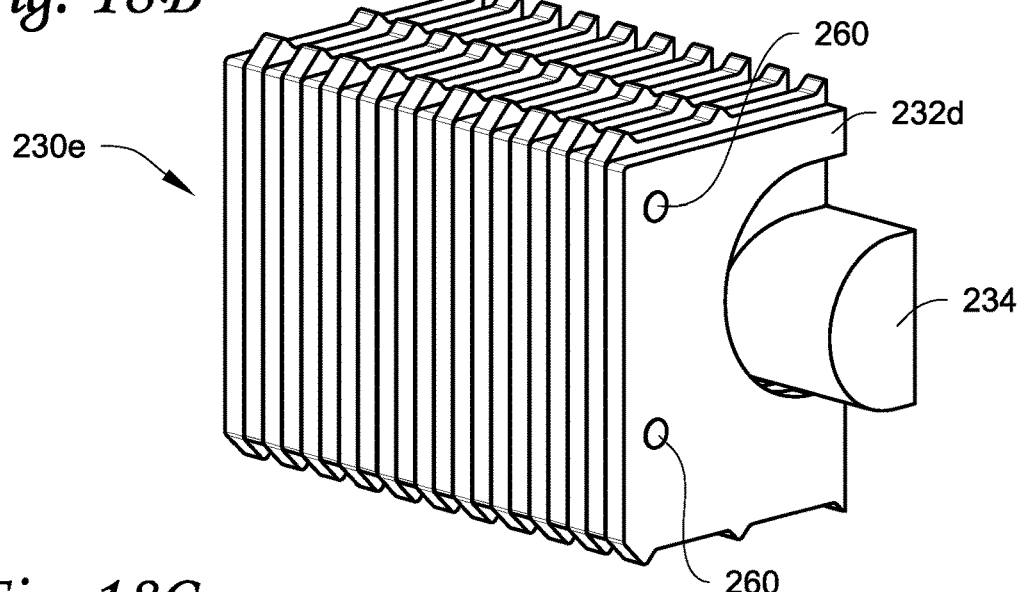
FIG. 18B is a perspective view of a compliant ground block, according to one embodiment.
Figure 18C:
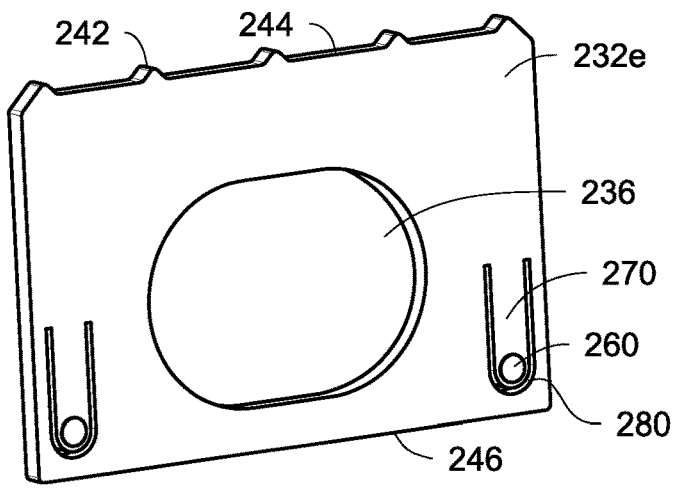
FIG. 18C is a perspective view of a blade, according to another embodiment.

FIG. 18A is a perspective view of a blade 232d, according to one embodiment. FIG. 18B is a perspective view of a compliant ground block 230e, according to one embodiment. FIG. 18C is a perspective view of a blade 232e, according to another embodiment.

It will be appreciated that the blades 232d and/or 232e are the same as other blades such as 232 and 232a-232c, except that the blades 232d and/or 232e include bumps 260. The blade 232d include one or more bumps 260. It will be appreciated that bump(s) may be part of the same material as the blade and are fabricated in the same process as the blade. The thickness of the bump(s) may be generally at or less than 10% of the thickness of the blade. As shown in FIG. 18A, the blade 232d includes four bumps 260 near four corners of the blade 232d on a main side surface of the blade. Each bump 260 has a circular or any other suitable shape and extends (or is raised) in the thickness direction.

The blade 232e has one or more slight flexible cantilever member 270. A U-shape opening 280 separates the cantilever member 270 from other part of the blade 232e. The bump is disposed on or near the tip of the cantilever member 270. As shown in FIG. 18C, the blade 232e include two or more cantilever members 270, each cantilever member 270 is disposed between an end of the aperture and an edge of the blade 232e.

The bump(s) 260 can ensure electrical reliability (e.g., electrical connection reliability) from blade to blade, and focus the contact points to specific spots to guarantee reliable connection and provide some compliance in the blades stack-up.

It will be appreciated that the bumps can help to maintain good electrical contact among blades flat blades an slide up and down when compressed or uncompressed, and the biasing of the blades to each other is critical. If there are some debris between the two blades, the debris can decrease the electrical conductivity between the two blades. The bumps can help to improve the electrical connection between the blades on the PCB (load board or socket) side or on the DUT side. The bumps can put high stress points through the blades. When the bumps are on the tip of the cantilever, a flexible feature can be achieved.

Figure 19A:
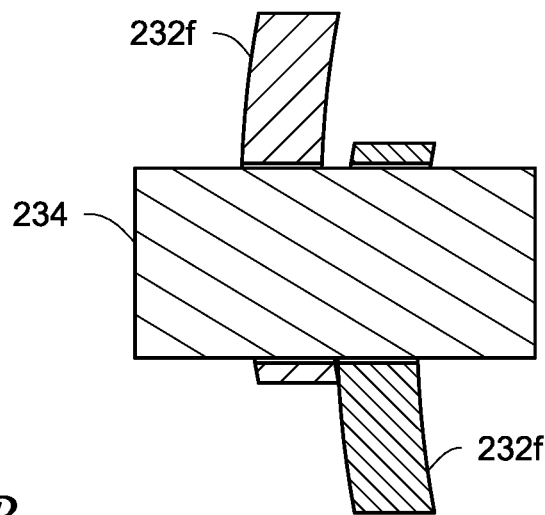
FIG. 19A is a cross-sectional view of blades, according to one embodiment.
Figure 19B:
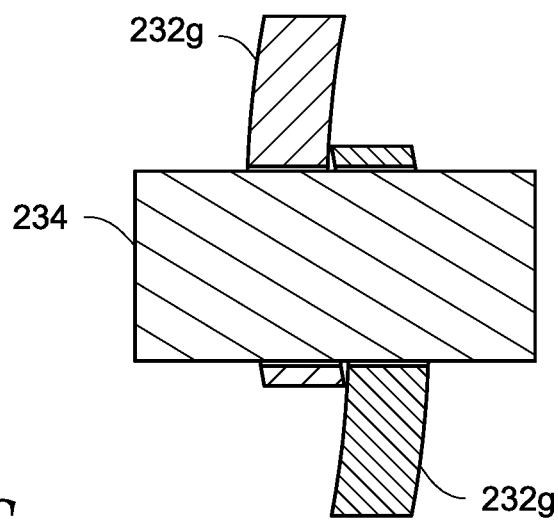
FIG. 19B is a cross-sectional view of blades, according to another embodiment.
Figure 19C:
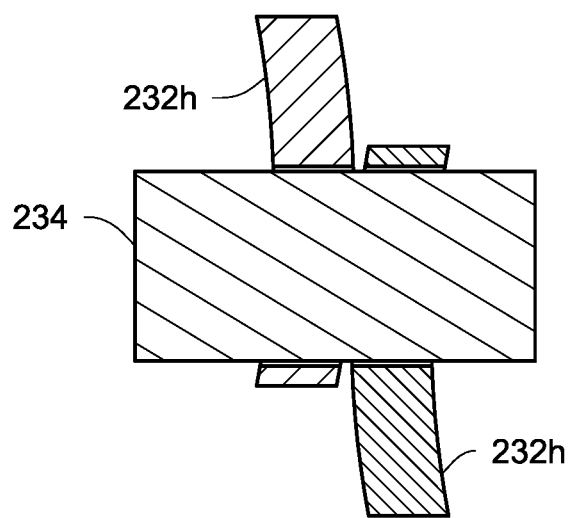
FIG. 19C is a cross-sectional view of blades, according to yet another embodiment.
Figure 19D:
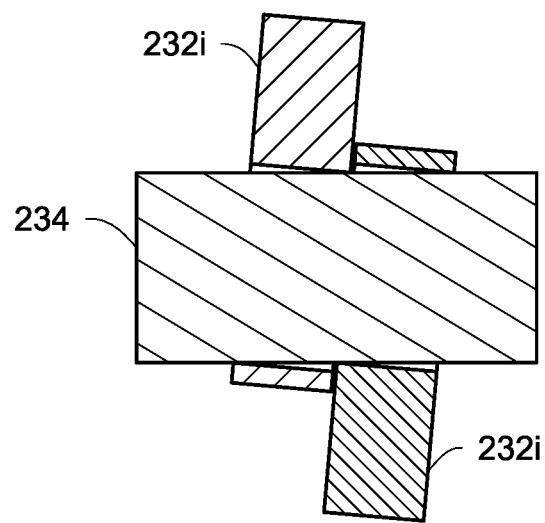
FIG. 19D is a cross-sectional view of blades, according to yet another embodiment.

FIG. 19A is a cross-sectional view of blades 232f, according to one embodiment. FIG. 19B is a cross-sectional view of blades 232g, according to another embodiment. FIG. 19C is a cross-sectional view of blades 232h, according to yet another embodiment. FIG. 19D is a cross-sectional view of blades 232i, according to yet another embodiment.

Curved or nested blades can help to improve the electrical connection between blades. The blades can be flexible members, allowing for thickness compliance. The blades can be fabricated with a curve (e.g., in a few micron scale) in the height Z direction. When the curved blades are stacked, higher force concentrations can improve the electrical contact pressure and lower contact resistance. The blades (i.e., the shapes of a blade and the adjacent blade) can be nested in various concave and/or convex configurations, such as concave-convex nesting 232f, concave-concave nesting 232g, and convex-convex nesting 232h. The curves (convex, concave, etc.) can cause higher contact points and higher contact pressure from blade to blade. The blades can be tilted or angled blades 232i. Slightly angling the blades 232i can naturally bias (e.g., creating a normal force between the blades) each blade against the mating/adjacent plate over the compression cycle. The angle of the blade can vary from at or about 2 degrees to at or about 5 degrees from vertical.

Figure 20:
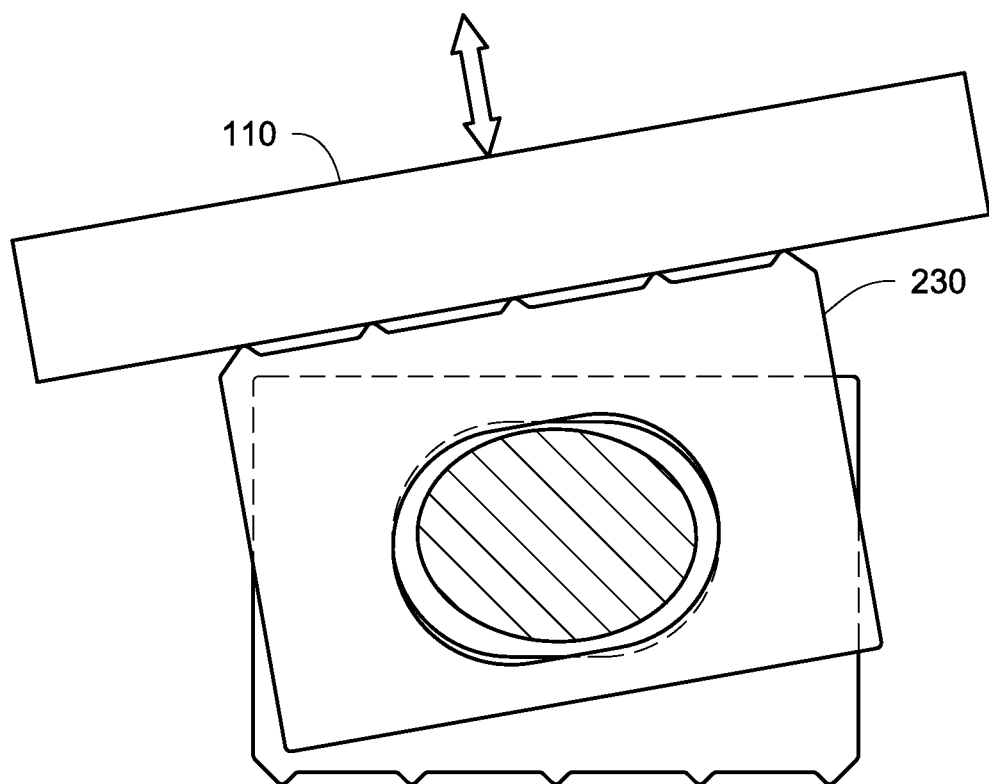
FIG. 20 is a cross-sectional view of a compliant ground block, according to one embodiment.
Figure 21A:
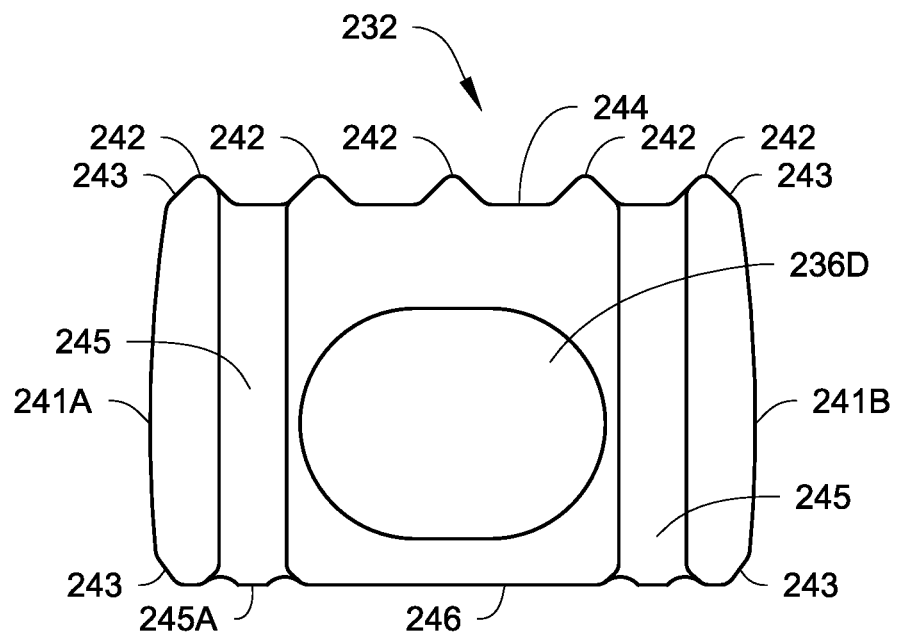
FIGS. 21A-21E are side views of a blade, according to some embodiments.
Figure 21B:
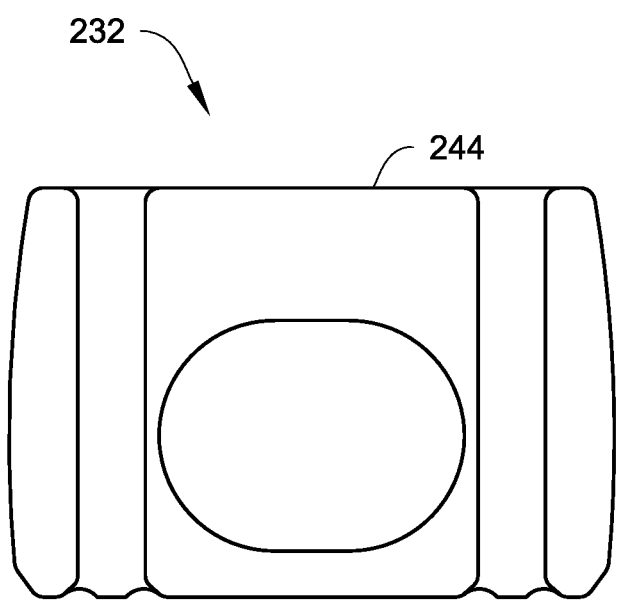
Figure 21C:
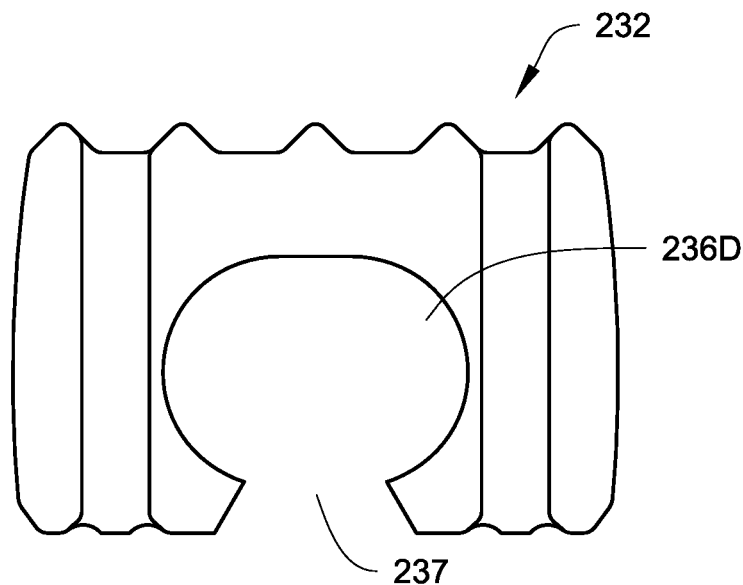
Figure 21D:
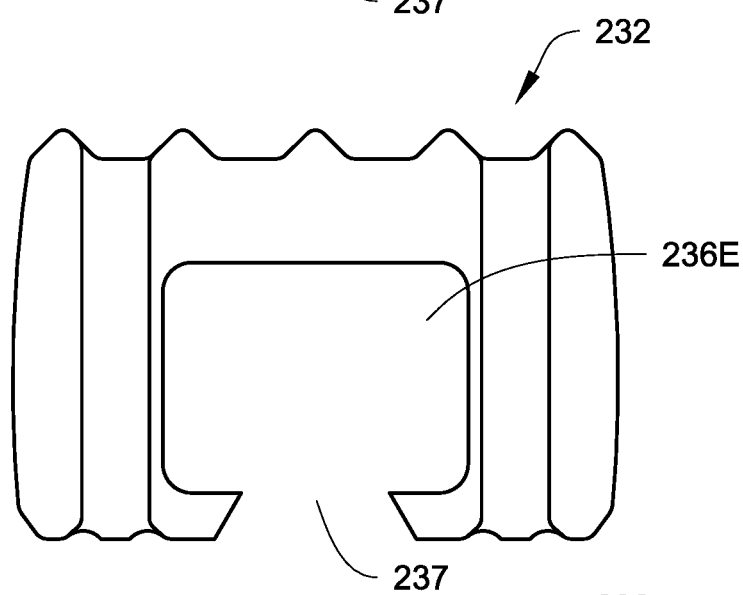
Figure 21E:
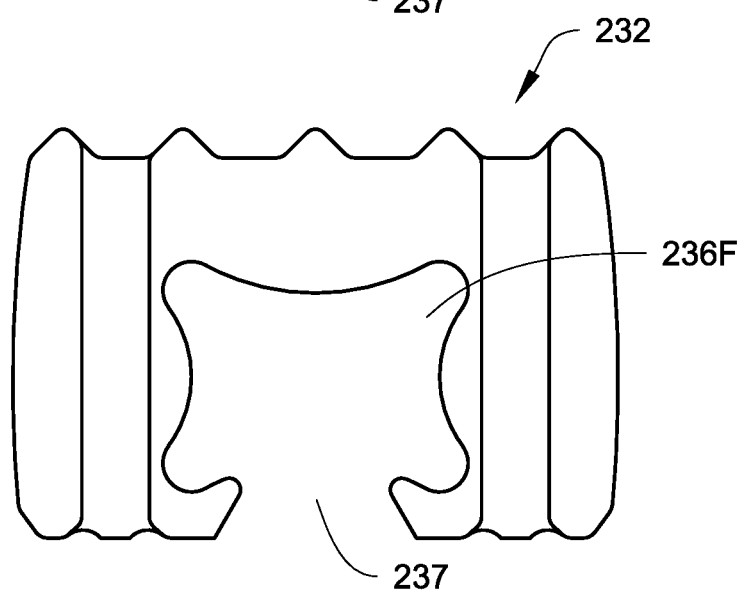

FIG. 20 is a cross-sectional view of a compliant ground block 230, according to one embodiment. FIG. 20 shows a DUT 110 on top of a compliant ground block 230, where the DUT 110 is not presented perfectly flat. Such embodiment allows for a gimbaling motion—allowing for ground pads that are not flat. FIG. 20 illustrates that not only is the blade stack (i.e., the compliant ground block 230) compliant in the Z direction, but the compliant ground block 230 allows for compliance if a DUT 110 is presented into the ground block at a slight angle, allowing for imperfections in the part handling.

FIGS. 21A-21E are side views of a blade 232, according to some embodiments. It will be appreciated that the blade 232 of FIGS. 21A-21E can be the same as or similar to the blade 232 of FIGS. 10A and 10B (including the centerlines C1 and C2 as shown in FIG. 10A), except for the differences explicitly described hereinafter.

In an embodiment, the blade 232 can include a radius 241A at one side of the blade 232. The blade 232 can also include a radius 241B at the other side of the blade 232 opposite to the one side of the blade 232 in the width/transverse direction (X direction). The radius (241A and/or 241B) can extend from the top end 244 of the blade 232 to the bottom end 246 of the blade 232. It will be appreciated that the radius (241A and/or 241B) can provide improved assembly ease and allow blades 232 to tip and/or rock without catching on the housing 220.

In an embodiment, the blade 232 can include chamfer 243 at one or more of the four corners of the blade 232. The chamfer 243 can extend from the side (241A or 241B) of the blade 232 to the end (244 or 246) of the blade 232. It will be appreciated that the corner chamfer(s) 243 can provide improved assembly ease. In an embodiment, compared with the protrusion(s) 242 of FIGS. 10A and 10B, the protrusion(s) or tip(s) 242 in FIGS. 24A and 24C-24E can be larger and can provide increased life and better wear conditions. It will be appreciated that in an embodiment (see FIG. 21B), the blade 232 can have a flat top end 244 without any protrusion 242 for low inductance and/or high gain applications.

In some embodiments, compared with the aperture 236 in FIGS. 10A and 10B, the apertures 236D-236F in FIGS. 21A-21E can have an increased size and can make room for a larger elastomer and provide more compliance. In some embodiments, the blade 232 can have an elliptical aperture 236D, a rectangular aperture 236E for increased compliance compared with the elliptical aperture, and/or an "X" shaped aperture 236F for increased compliance and increased contact forces compared with the elliptical aperture.

In an embodiment, the blade 232 can include one or more relief channels 245. The relief channel 245 can be disposed at a position (e.g., between the protrusions 242) between the aperture (e.g., 236D-236F) and a side (241A or 241B) in the X direction. The relief channel 245 can extend from the top end 244 of the blade 232 to the bottom end 246 of the blade 232 in the height direction (Z direction). The relief channel 245 can be recessed from the main surface of the blade 232 in the thickness direction (Y direction) of the blade 232. The relief channel 245 can include a breakoff tab 245A at an end of the relief channel 245 near the bottom end 246. Curved (e.g., in the Z direction) recesses can be disposed at one or more of the two sides of the breakoff tab 245A in the X direction. It will be appreciated that the relief channel(s) 245 can reduce wear from the breakoff tab(s) 245A that may diminish life, and can add clearance that prevents wear and corrosion so that the blades 232 can meet the life specifications at a desired temperature.

In an embodiment, the blade 232 can include a notch (or opening) 237 extending from the bottom end 246 of the blade to the aperture (236D-236F). It will be appreciated that the notch 237 can have a trapezoid shape with a base at the bottom being longer than the base at the top of the notch 237. One or more or the bases of the notch 237 may have a length less than the length of the aperture (236D-236F) in the X direction. Notch 237 may be any discontinuity in the aperture which allows for insertion of the elastomer. The notch or gap 237 preferably provides a one way opening which allows and elastomer to be received therein but inhibits it removal, primarily to having a larger peripheral gap and relative to the (smaller) inner gap. This can be accomplished with a tapering of the gap from external to internal. The notch is preferably in the bottom wall, but may be an intrusion in to any wall. It will also be appreciated that the notch 237 can aid in elastomer assembly in production or for field serviceability.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

Aspects

It is noted that any one of aspects below can be combined with each other.

Aspect 1. A compliant ground block for a testing system for testing integrated circuit devices, comprising:
- a plurality of electrically conductive blades in a side by side generally parallel relationship, said blades configured to be longitudinally slidable with respect to each other; and
- an elastomer configured to retain the plurality of blades,
- each blade of the plurality of blades includes a first end and a second end opposite to the first end in the longitudinal direction,
- the plurality of blades is arranged so that the first end of each blade of the plurality of blades is opposite to the first end of an adjacent blade in the longitudinal direction, so that the first end of one blade is adjacent the second end of the adjacent blade,
- the elastomer being at least tubular in part and non-conductive.

Aspect 2. The compliant ground block according to aspect 1, wherein each blade of the plurality of blades includes a plurality of protrusions at the first end.

Aspect 3. The compliant ground block according to aspect 1 or aspect 2, wherein each blade of the plurality of blades has a flat surface at the first end.

Aspect 4. The compliant ground block according to any one of aspects 1-3, wherein each blade of the plurality of blades includes an aperture,
- the aperture is elongated in a transverse direction,
- the elastomer extends in a thickness direction through the aperture,
- the aperture is disposed below a centerline in the longitudinal direction so that the plurality of blades is staggered in the longitudinal direction.

Aspect 5. The compliant ground block according to aspect 4, wherein the elastomer has a cylindrical shape,
- the compliant ground block has a compressed state and an uncompressed state,
- in the uncompressed state, cavities are formed between the elastomer and sides of the aperture in the transverse direction.

Aspect 6. The compliant ground block according to any one of aspects 1-5, wherein each blade of the plurality of blades includes at least two apertures arranged side by side in a transverse direction,
  the compliant ground block includes at least two elastomers,
  each of the at least two apertures is elongated in the transverse direction,
  the at least two elastomers extend in a thickness direction through the at least two apertures, respectively,
  the at least two apertures are disposed below a centerline in the longitudinal direction so that the plurality of blades is staggered in the longitudinal direction.

Aspect 7. The compliant ground block according to any one of aspects 1-6, wherein the plurality of blades has recesses at sides of the plurality of blades in a thickness direction,
  the elastomer has a loop shape and is configured to snap over the recesses around the plurality of blades.

Aspect 8. The compliant ground block according to any one of aspects 1-7, wherein the plurality of blades has recesses in the sides of the plurality of blades in a thickness direction,
  the compliant ground block includes at least two elastomers,
  the at least two elastomers have a cylindrical shape and extend in a thickness direction,
  the at least two elastomers are configured to be biased into the recesses, respectively.

Aspect 9. The compliant ground block according to any one of aspects 1-8, wherein each blade of the plurality of blades includes an aperture,
  each blade of the plurality of blades includes radius at edges of the aperture in a thickness direction.

Aspect 10. The compliant ground block according to any one of aspects 1-9, wherein each blade of the plurality of blades includes at least one bump disposed on a side surface of each blade of the plurality of blades,
  the at least one bump extends in a thickness direction.

Aspect 11. The compliant ground block according to aspect 10, wherein the at least one bump is disposed on a cantilever member disposed on the side surface of each blade of the plurality of blades.

Aspect 12. The compliant ground block according to any one of aspects 1-11, wherein each blade of the plurality of blades has a curve extending in the longitudinal direction,
  curves of adjacent blades of the plurality of blades are arranged in a concave-convex nesting manner.

Aspect 13. The compliant ground block according to any one of aspects 1-12, wherein each blade of the plurality of blades has a curve extending in the longitudinal direction,
  curves of adjacent blades of the plurality of blades are arranged in a concave-concave nesting manner.

Aspect 14. The compliant ground block according to any one of aspects 1-13, wherein each blade of the plurality of blades has a curve extending in the longitudinal direction,
  curves of adjacent blades of the plurality of blades are arranged in a convex-convex nesting manner.

Aspect 15. The compliant ground block according to any one of aspects 1-14, wherein each blade of the plurality of blades is tilted away from the longitudinal direction towards a thickness direction.

Aspect 16. The compliant ground block according to aspect 15, wherein an angle that each blade of the plurality of blades is tilted away from the longitudinal direction towards a thickness direction is at or about two degrees to at or about four degrees.

Aspect 17. A testing system for testing integrated circuit devices, comprising:
  a device under test; and
  a compliant ground block including:
    a plurality of blades; and
    an elastomer configured to retain the plurality of blades,
    wherein each blade of the plurality of blades includes a first end and a second end opposite to the first end in a longitudinal direction,
    the plurality of blades is arranged so that the first end of each blade of the plurality of blades is opposite to the first end of an adjacent blade in the longitudinal direction,
    the elastomer includes a non-conductive outer surface,
    the plurality of blades includes a conductive outer surface,
  wherein a size of the compliant ground block is at least partially aligned with a ground pad of the device under test.

Aspect 18. The testing system according to aspect 17, further comprising:
  a housing,
  wherein the compliant ground block is disposed inside the housing,
  the elastomer is wedged into the housing to retain the compliant ground block in the housing.

Aspect 19. The testing system according to aspect 17 or aspect 18, further comprising:
  a socket;
  a load board;
  wherein the socket is configured to provide a pathway from inputs and outputs of the device under test to inputs and outputs of the load board, respectively.

Aspect 20. A method of assembling and positioning a compliant ground block in a testing system for testing integrated circuit devices, the method comprising:
  arranging a plurality of electrically conductive blades of the compliant ground block so that a first end of each blade of the plurality of blades is opposite to a first end of an adjacent blade in a longitudinal direction, the first end of one blade being adjacent a second end of an adjacent blade, the second end being opposite to the first end in the longitudinal direction;
  retaining the blades with an elastomer of the compliant ground block, the blades being in a side by side generally parallel relationship, the blades being configured to be longitudinally slidable with respect to each other, and the elastomer being at least tubular in part and non-conductive; and
  installing the compliant ground block in a housing.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A compliant ground block for a testing system for testing integrated circuit devices, comprising:
   a plurality of electrically conductive blades in a side by side generally parallel relationship, said blades configured to be longitudinally slidable with respect to each other; and
   an elastomer configured to retain the plurality of blades, the plurality of blades being in electrical contact with each other,
   wherein each blade of the plurality of blades includes a first end and a second end opposite to the first end in the longitudinal direction,
   the plurality of blades is arranged so that the first end of each blade of the plurality of blades is opposite to the first end of an adjacent blade in the longitudinal direction, so that the first end of one blade is adjacent the second end of the adjacent blade,
   the elastomer being at least tubular in part and non-conductive.

2. The compliant ground block according to claim 1, wherein each blade of the plurality of blades includes a plurality of protrusions at the first end, or each blade of the plurality of blades has a flat surface at the first end.

3. The compliant ground block according to claim 1, wherein each blade of the plurality of blades includes an aperture,
   the aperture is elongated in a transverse direction,
   the elastomer extends in a thickness direction through the aperture,
   the aperture is disposed below a centerline in the longitudinal direction so that the plurality of blades is staggered in the longitudinal direction.

4. The compliant ground block according to claim 3, wherein the elastomer has a cylindrical shape,
   the compliant ground block has a compressed state and an uncompressed state,
   in the uncompressed state, cavities are formed between the elastomer and sides of the aperture in the transverse direction.

5. The compliant ground block according to claim 1, wherein each blade of the plurality of blades includes at least two apertures arranged side by side in a transverse direction,
   the compliant ground block includes at least two elastomers,
   each of the at least two apertures is elongated in the transverse direction,
   the at least two elastomer extend in a thickness direction through the at least two apertures, respectively,
   the at least two apertures are disposed below a centerline in the longitudinal direction so that the plurality of blades is staggered in the longitudinal direction.

6. The compliant ground block according to claim 1, wherein the plurality of blades has recesses at sides of the plurality of blades in a thickness direction,
   the elastomer has a loop shape and is configured to snap over the recesses around the plurality of blades.

7. The compliant ground block according to claim 1, wherein the plurality of blades has recesses in the sides of the plurality of blades in a thickness direction,
   the compliant ground block includes at least two elastomers,
   the at least two elastomers have a cylindrical shape and extend in a thickness direction,
   the at least two elastomers are configured to be biased into the recesses, respectively.

8. The compliant ground block according to claim 1, wherein each blade of the plurality of blades includes an aperture,
   each blade of the plurality of blades includes radius at edges of the aperture in a thickness direction.

9. The compliant ground block according to claim 1, wherein each blade of the plurality of blades includes at least one bump disposed on a side surface of each blade of the plurality of blades,
   the at least one bump extends in a thickness direction.

10. The compliant ground block according to claim 9, wherein the at least one bump is disposed on a cantilever member disposed on the side surface of each blade of the plurality of blades.

11. The compliant ground block according to claim 1, wherein each blade of the plurality of blades has a curve extending in the longitudinal direction,
    curves of adjacent blades of the plurality of blades are arranged in a concave-convex nesting manner.

12. The compliant ground block according to claim 1, wherein each blade of the plurality of blades has a curve extending in the longitudinal direction,
    curves of adjacent blades of the plurality of blades are arranged in a concave-concave nesting manner.

13. The compliant ground block according to claim 1, wherein each blade of the plurality of blades has a curve extending in the longitudinal direction,
    curves of adjacent blades of the plurality of blades are arranged in a convex-convex nesting manner.

14. The compliant ground block according to claim 1, wherein each blade of the plurality of blades is tilted away from the longitudinal direction towards a thickness direction.

15. The compliant ground block according to claim 14, wherein an angle that each blade of the plurality of blades is tilted away from the longitudinal direction towards a thickness direction is at or about two degrees to at or about four degrees.

16. The compliant ground block according to claim 1, wherein adjacent blades of the plurality of blades are in direct contact with each other.

17. A testing system for testing integrated circuit devices, comprising:
    a device under test; and
    a compliant ground block including:
      a plurality of blades; and
      an elastomer configured to retain the plurality of blades,
      wherein each blade of the plurality of blades includes a first end and a second end opposite to the first end in a longitudinal direction,
      the plurality of blades is arranged so that the first end of each blade of the plurality of blades is opposite to the first end of an adjacent blade in the longitudinal direction,
      the elastomer includes a non-conductive outer surface,
      the plurality of blades includes a conductive outer surface,
    wherein a size of the compliant ground block is at least partially aligned with a ground pad of the device under test, and
    wherein each blade of the plurality of blades includes a plurality of protrusions at the first end, or each blade of the plurality of blades has a flat surface at the first end.

18. The testing system according to claim 17, further comprising:
a housing,
wherein the compliant ground block is disposed inside the housing,
the elastomer is wedged into the housing to retain the compliant ground block in the housing.

19. The testing system according to claim 17, further comprising:
a socket;
a load board;
wherein the socket is configured to provide a pathway from inputs and outputs of the device under test to inputs and outputs of the load board, respectively.

20. A method of assembling and positioning a compliant ground block in a testing system for testing integrated circuit devices, the method comprising:
arranging a plurality of electrically conductive blades of the compliant ground block so that a first end of each blade of the plurality of blades is opposite to a first end of an adjacent blade in a longitudinal direction, the first end of one blade being adjacent a second end of an adjacent blade, the second end being opposite to the first end in the longitudinal direction;
retaining the blades with an elastomer of the compliant ground block, the blades being in a side by side generally parallel relationship, the blades being configured to be longitudinally slidable with respect to each other, and the elastomer being at least tubular in part and non-conductive; and
installing the compliant ground block in a housing,
wherein each blade of the plurality of blades includes a plurality of protrusions at the first end, or each blade of the plurality of blades has a flat surface at the first end.

* * * * *